(12) United States Patent
Igor et al.

(10) Patent No.: US 12,167,548 B2
(45) Date of Patent: Dec. 10, 2024

(54) FOLDABLE ELECTRONIC DEVICE

(71) Applicant: Samsung Electronics Co., Ltd., Gyeonggi-do (KR)

(72) Inventors: Ivanov Igor, Gyeonggi-do (KR); Seonho Hwang, Gyeonggi-do (KR); Hyungsok Yeo, Gyeonggi-do (KR); Feygenson Oleg, Gyeonggi-do (KR); Minwoo Yoo, Gyeonggi-do (KR); Changryong Heo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 234 days.

(21) Appl. No.: 17/852,862

(22) Filed: Jun. 29, 2022

(65) Prior Publication Data

US 2022/0330438 A1    Oct. 13, 2022

Related U.S. Application Data

(63) Continuation of application No. PCT/KR2021/018074, filed on Dec. 2, 2021.

(30) Foreign Application Priority Data

Dec. 2, 2020 (KR) .................. 10-2020-0166451
Mar. 4, 2021 (KR) .................. 10-2021-0028830
Nov. 5, 2021 (KR) .................. 10-2021-0151129

(51) Int. Cl.
*H05K 5/00* (2006.01)
*H05K 5/02* (2006.01)

(52) U.S. Cl.
CPC ......... *H05K 5/0017* (2013.01); *H05K 5/0226* (2013.01)

(58) Field of Classification Search
None
See application file for complete search history.

(56) References Cited

U.S. PATENT DOCUMENTS 9,778,689 B2   10/2017  Song et al.
10,297,785 B2   5/2019  Ahn et al.
(Continued)

FOREIGN PATENT DOCUMENTS

CN   109286702 A   1/2019
CN   109345957 A   2/2019
(Continued)

OTHER PUBLICATIONS

European Search Report dated Feb. 26, 2024.

*Primary Examiner* — Stephen W Jackson
(74) *Attorney, Agent, or Firm* — Cha & Reiter, LLC

(57) ABSTRACT

A foldable electronic device is disclosed, including: a first through fourth housing, defining a first and second surface, a first through third hinge structure, a first hinge structure connecting the first housing and the third housing, a second hinge structure connecting the second housing and the fourth housing, and a third hinge structure connecting the first housing and the second housing, a first display including four regions, a first through third flexible regions, a second display including first and second regions, and defining a fourth flexible region, a first elastic body, wherein the first display defines a first and second folding axis of the device, and the second display defines a third folding axis of the device, wherein the first display is foldable about each of the first folding axis and the second folding axis, and the second display is foldable about the third folding axis.

20 Claims, 27 Drawing Sheets

(56) References Cited

U.S. PATENT DOCUMENTS

| | | | |
|---|---|---|---|
| 2007/0279315 A1 | 12/2007 | Laves et al. | |
| 2010/0041439 A1 | 2/2010 | Bullister | |
| 2012/0264489 A1* | 10/2012 | Choi | H04M 1/0247 455/566 |
| 2014/0306864 A1* | 10/2014 | Nakamura | G06F 1/1624 345/1.3 |
| 2014/0375530 A1 | 12/2014 | Delaporte | |
| 2016/0040462 A1* | 2/2016 | Nakamura | E05D 3/022 16/248 |
| 2017/0038794 A1 | 2/2017 | Song et al. | |
| 2017/0229100 A1 | 8/2017 | Chun et al. | |
| 2019/0027703 A1 | 1/2019 | Ahn et al. | |
| 2020/0012318 A1 | 1/2020 | Delaporte | |

FOREIGN PATENT DOCUMENTS

| | | |
|---|---|---|
| CN | 110727311 A | 1/2020 |
| CN | 210072464 U | 2/2020 |
| CN | 111128006 A | 5/2020 |
| CN | 111637147 A | 9/2020 |
| EP | 2 403 222 A1 | 1/2012 |
| EP | 3 076 265 A2 | 10/2016 |
| KR | 20-2010-0007624 U | 7/2010 |
| KR | 10-2016-0024151 A | 3/2016 |
| KR | 10-2016-0118041 A | 10/2016 |
| KR | 1663517 B | 10/2016 |
| KR | 10-2020-0122479 A | 10/2020 |
| WO | 2013/154275 A1 | 10/2013 |

* cited by examiner

FOLDABLE ELECTRONIC DEVICE

CROSS-REFERENCE TO RELATED APPLICATIONS

This application is a continuation of International Application No. PCT/KR2021/018074 designating the United States, filed on Dec. 2, 2021, in the Korean Intellectual Property Receiving Office and claiming priority to Korean Patent Application No. 10-2020-0166451, filed on Dec. 2, 2020, Korean Patent Application No. 10-2021-0028830, filed on Mar. 4, 2021, and Korean Patent Application No. 10-2021-0151129, filed on Nov. 5, 2021, in the Korean Intellectual Property Office, the disclosures of which are incorporated by reference herein in their entireties.

BACKGROUND

1. Field

The following various example embodiments relate to a foldable electronic device, and, more particular, to a foldable electronic device foldable along two or more axes.

2. Description of Related Art

Recently, there have been developments in foldable electronic devices incorporating a flexible display using a hinge structure. For example, a foldable electronic device may include a display that is foldable along a folding axis running parallel to a long edge of the display, or a display that is foldable about a folding axis running parallel to a short edge of the display. Typically, users are able to fold the display and device only along one of these two possible directions.

SUMMARY

Various example embodiments provide a foldable electronic device including a display that is foldable in both directions according to a user's selection.

According to various example embodiments, a foldable electronic device may include: a first housing, a second housing, a third housing and a fourth housing, each having, respectively, a first surface and a second surface opposite to the first surface, a first hinge structure connecting the first housing and the third housing, a second hinge structure connecting the second housing and the fourth housing, and a third hinge structure connecting the first housing and the second housing, a first display including a first region located on a first surface of the first housing, a second region located on a first surface of the second housing, a third region located on a first surface of the third housing, a fourth region located on a first surface of the fourth housing, a first flexible region located above the first hinge structure between the first region and the third region, a second flexible region located above the third hinge structure between the first region and the second region, and a third flexible region located above the second hinge structure between the second region and the fourth region, a second display including a first region located on a second surface of the first housing, a second region located on a second surface of the second housing, and a fourth flexible region located above the third hinge structure between the first region and the second region, and a first elastic body connecting the first housing and an end portion of the first region of the second display, wherein the first display further includes a first folding axis located on the first flexible region and the third flexible region, and a second folding axis located on the second flexible region, wherein the second display includes a third folding axis located outside the fourth flexible region, and wherein the first display is foldable about each of the first folding axis and the second folding axis, and the second display is foldable about the third folding axis.

According to various example embodiments, a display area may be variably increased according to user manipulation.

According to various example embodiments, a variety of display configurations may be available even within a single device, according to user preference and manipulation.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
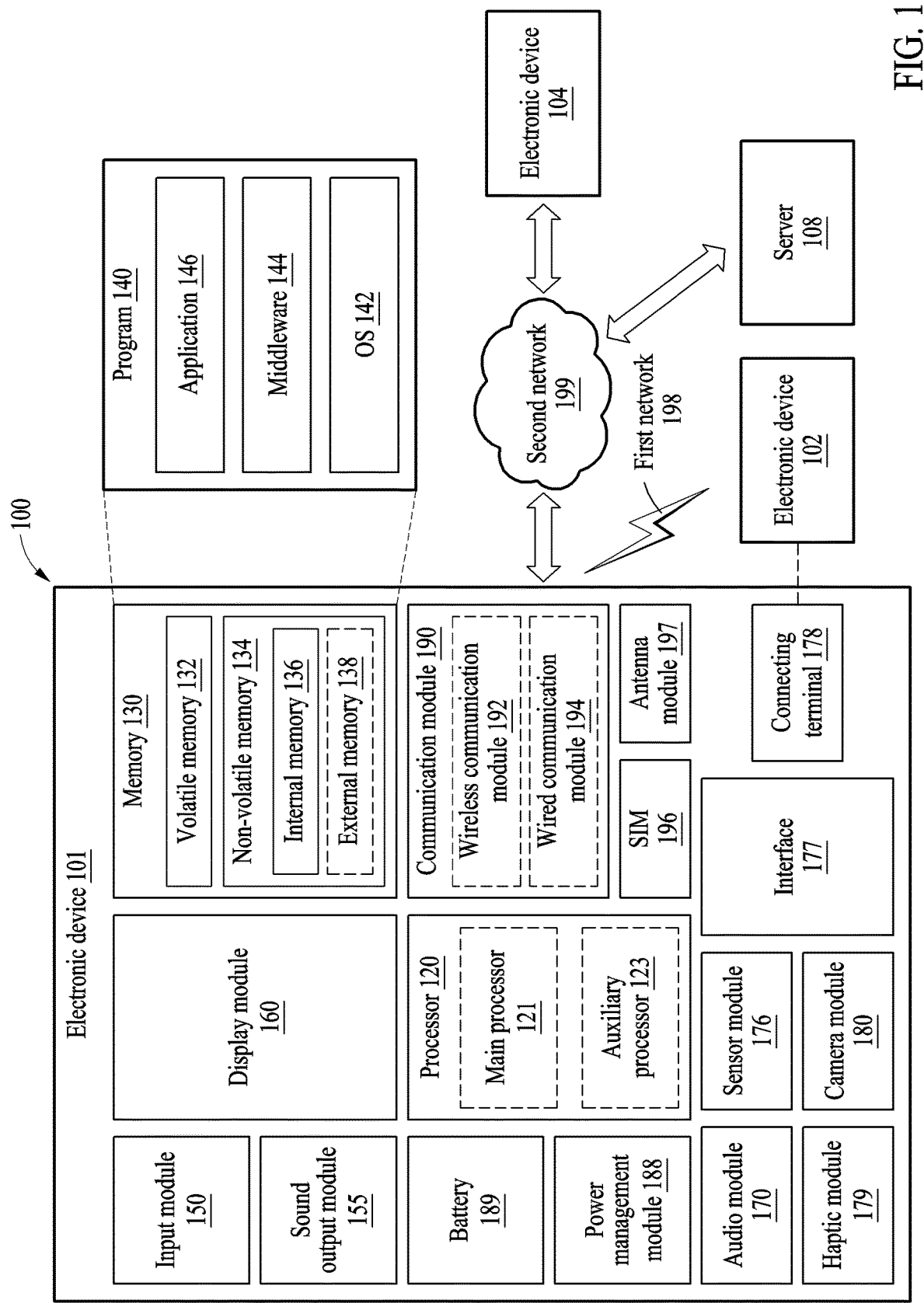
FIG. 1 is a block diagram illustrating an electronic device in a network environment according to various example embodiments.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide region network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138)

that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
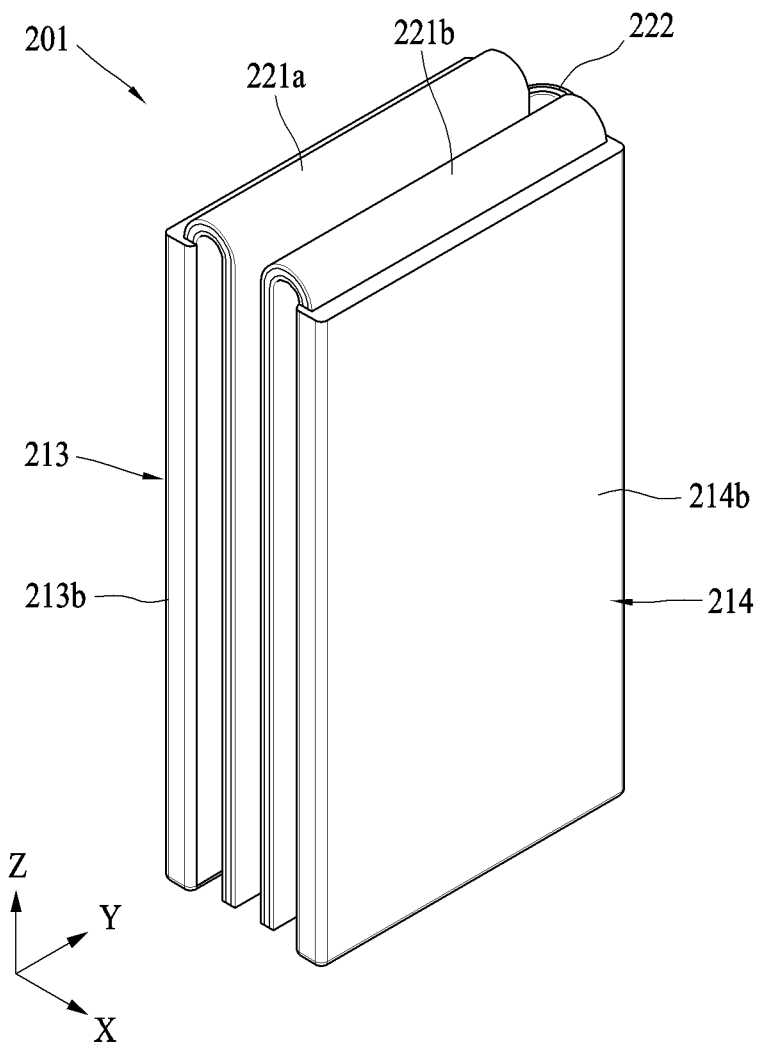
FIG. 2A is a perspective view of a compact electronic device according to various example embodiments.
Figure 2B:
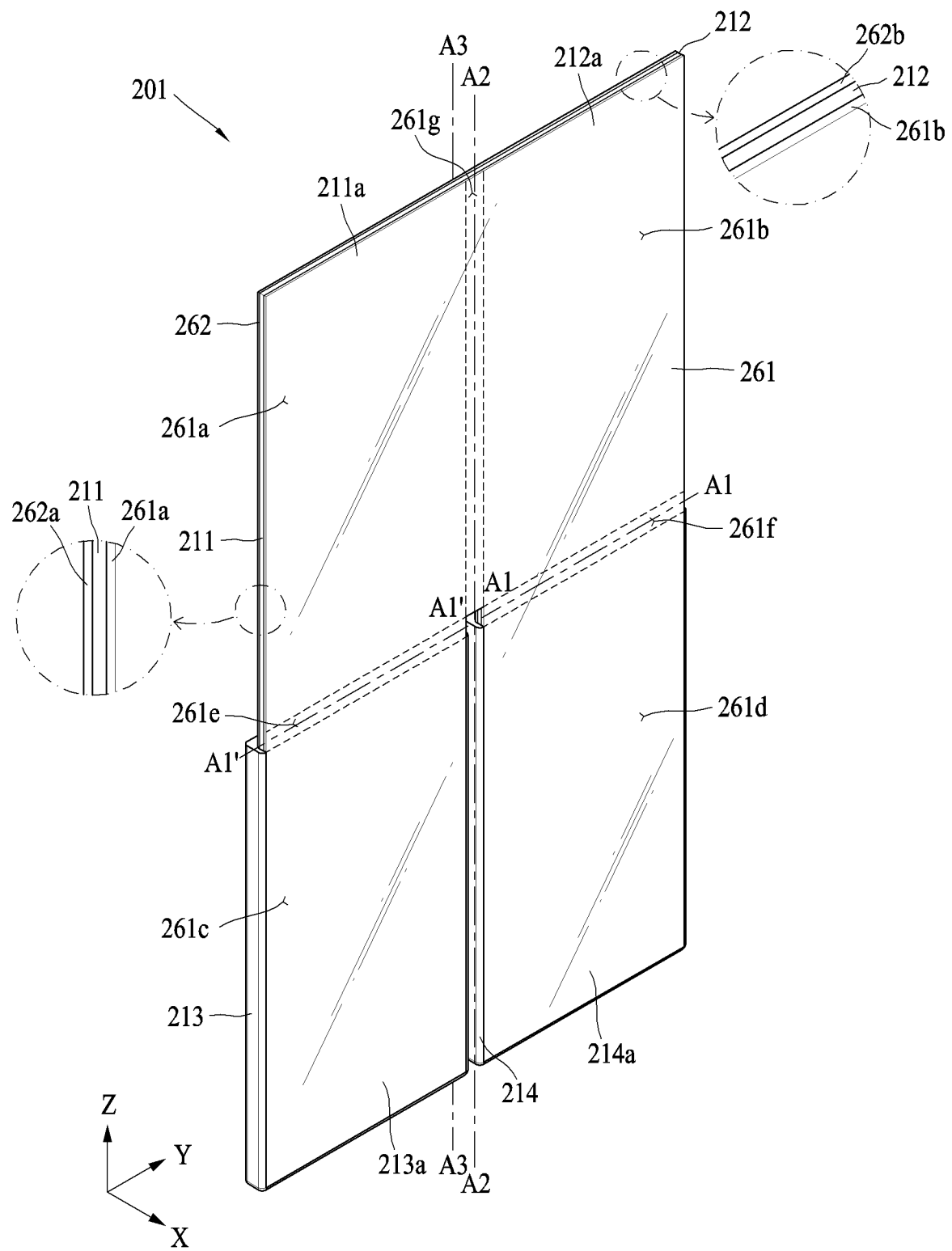
FIG. 2B is a perspective view illustrating a first expanded form of an electronic device as viewed in a first direction according to various example embodiments.
Figure 2C:
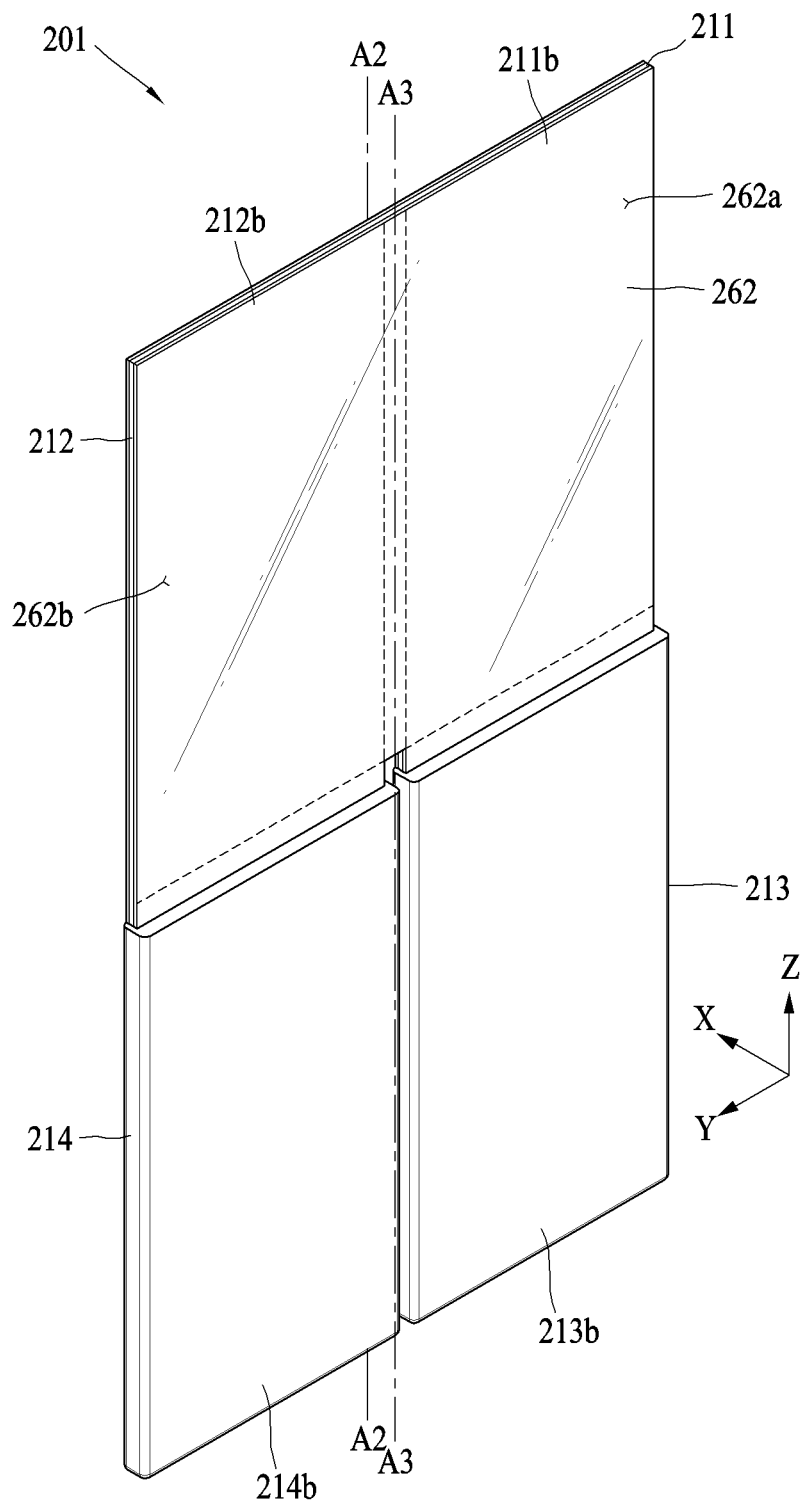
FIG. 2C is a perspective view illustrating the first expanded form of the electronic device as viewed in a second direction opposite to the first direction according to various example embodiments.
Figure 2D:
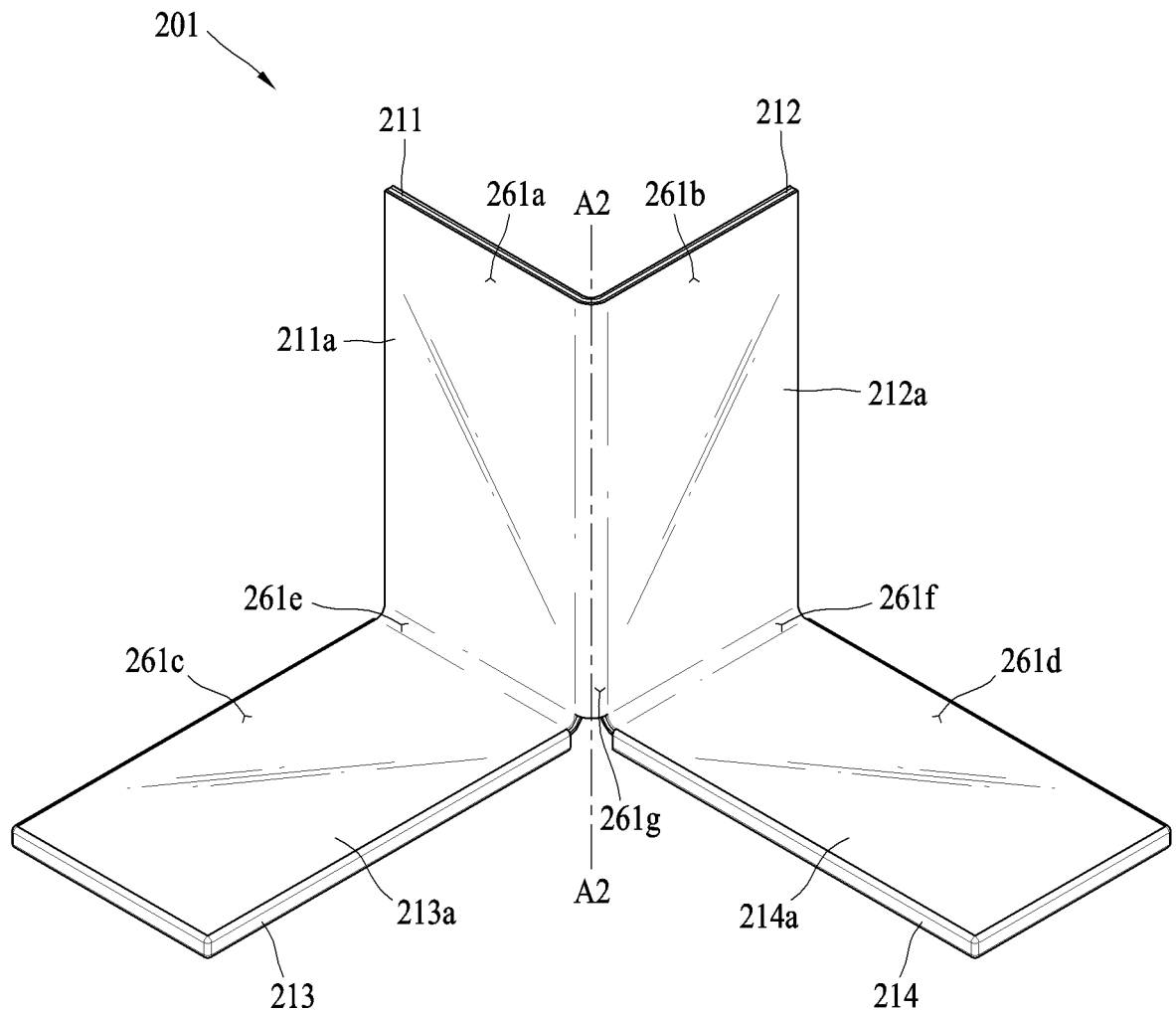
FIG. 2D is a perspective view illustrating a second expanded form of an electronic device as viewed in the first direction according to various example embodiments.
Figure 2E:
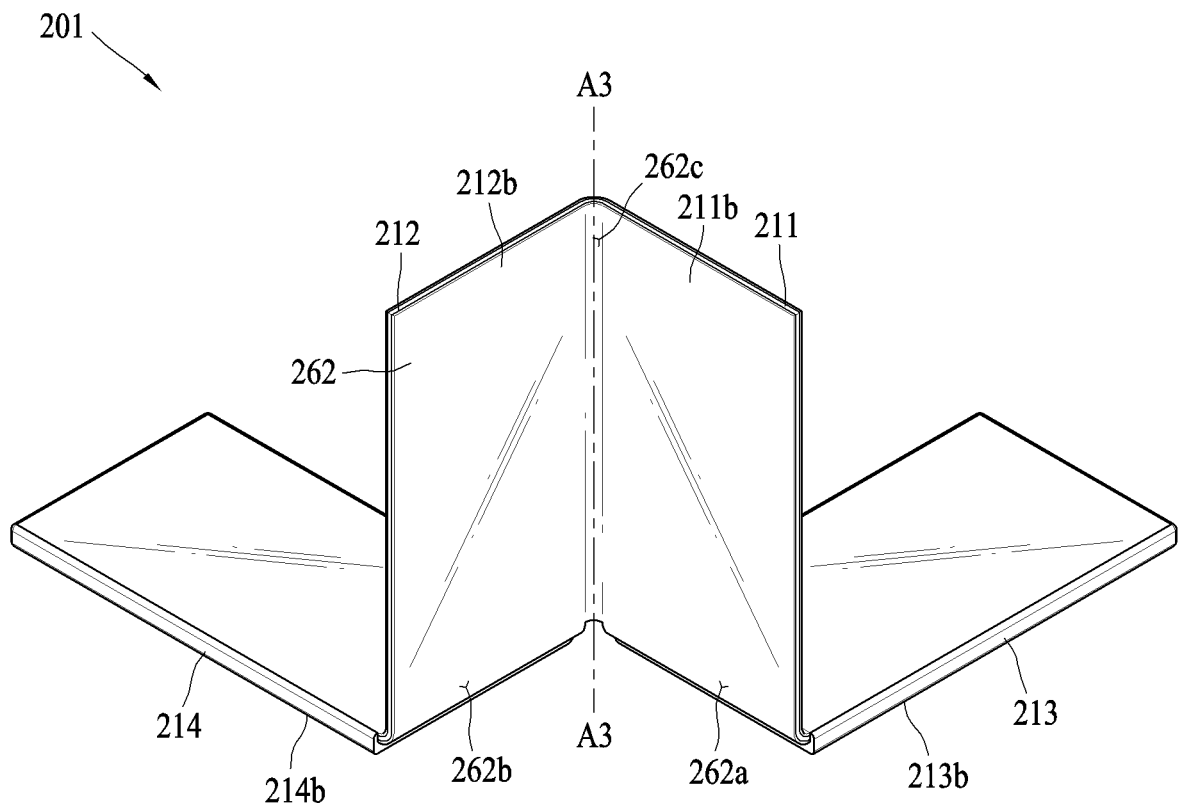
FIG. 2E is a perspective view illustrating the second expanded form of the electronic device as viewed in the second direction opposite to the first direction according to various example embodiments.

Referring to FIGS. 2A to 2E, an electronic device 201 according to various example embodiments may allow a variety of physical configurations using a single electronic device 201, including a plurality of displays 261 and 262. In FIG. 2A, an initial, folded form is shown, which may be a "compact" form of the device. In an example, the user may change the compact form of the electronic device 201 shown in FIG. 2A to an open form, in which a first display 261 and a second display 262 are unfolded outward about a second folding axis A2-A2 and unfolded inward about a third folding axis A3-A3, and in which the first display 261 is then unfolded about a first folding axis A1-A1, as shown in FIGS. 2B and 2C. In another example, the user may change the open form of the electronic device 201 shown in FIGS. 2B and 2C to a another form of the electronic device 201 of FIGS. 2D and 2E, in which the first display 261 is folded inward at a predetermined angle about the first folding axis A1-A1, and in which the first display 261 and the second display 262 are folded outward at a predetermined angle about the second folding axis A2-A2 and inward at a predetermined angle about the third folding axis A3-A3. The configurations of the electronic device 201 illustrated above as described above are merely examples, and it is obvious that the electronic device 201 may be used in various implementation forms and implementation order in addition to the above-described implementation forms and implementation order. Various implementation forms and implementation order of the electronic device 201 will be described in detail with reference to FIGS. 7 through 11 below.

Figure 3A:
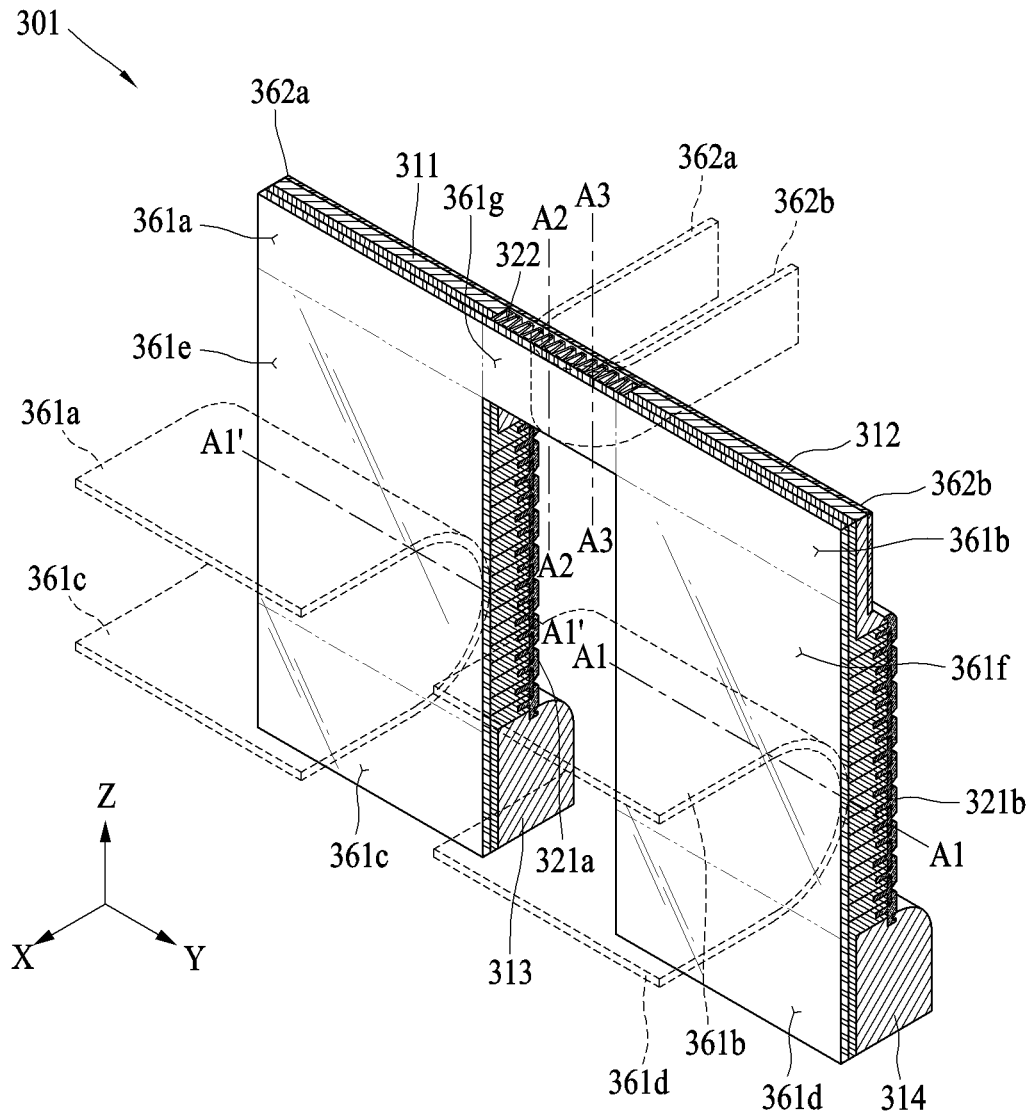
FIG. 3A is a cross-sectional view of a portion of an electronic device according to an example embodiment.
Figure 3B:
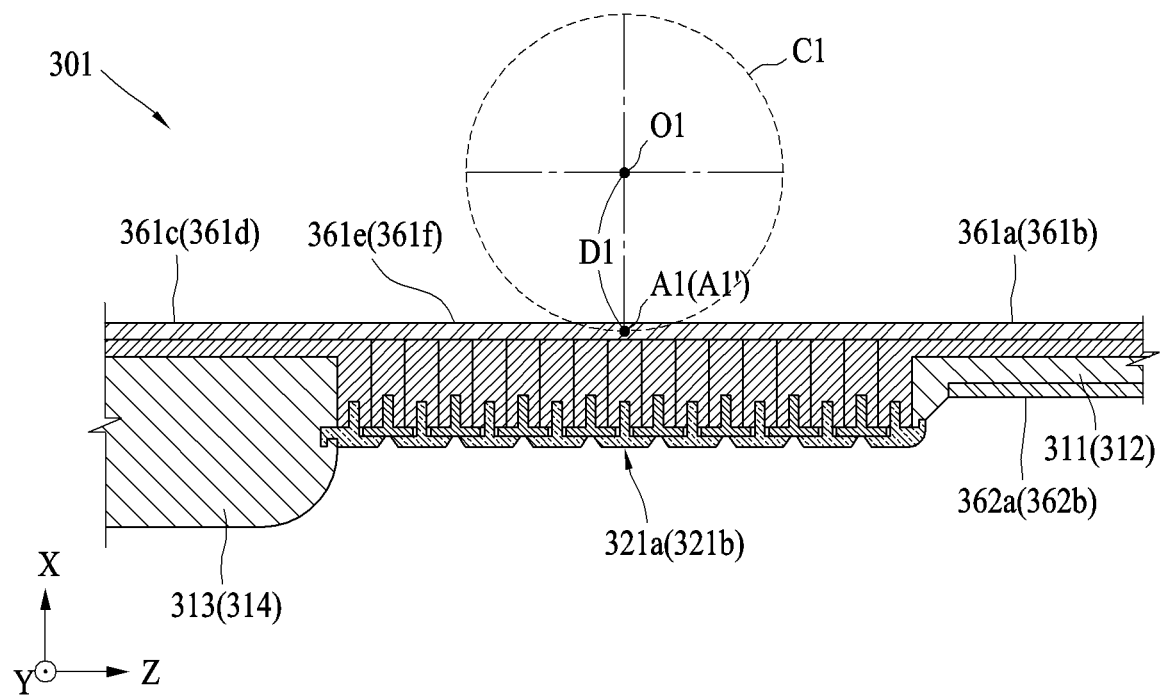
FIG. 3B is a cross-sectional view of the electronic device of FIG. 3A in a state in which a first display is not folded about a first folding axis, as viewed in a Y direction.
Figure 3C:
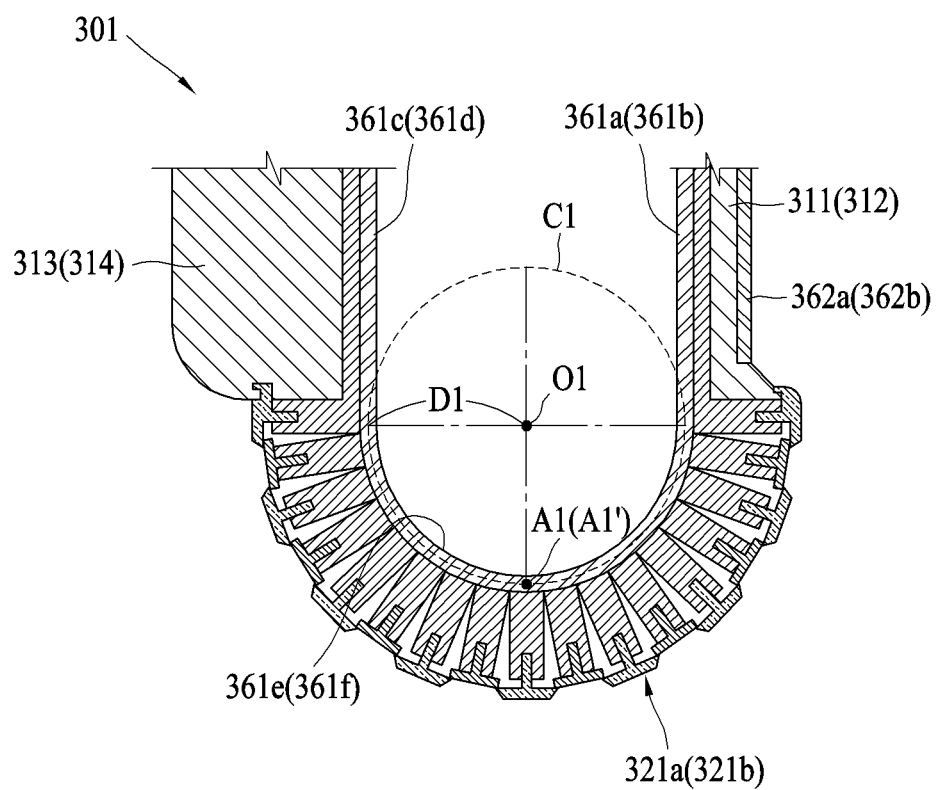
FIG. 3C is a cross-sectional view of the electronic device of FIG. 3A in a state in which the first display is folded about the first folding axis, as viewed in the Y direction.

The electronic device 201 may include a plurality of housings 211, 212, 213 and 214, the first display 261, the second display 262, and a hinge module including a plurality of hinge structures (e.g., a first hinge structure 321a, a second hinge structure 321b, and a third hinge structure 322 of FIG. 3A).

The plurality of housings 211 through 214 may include a first housing 211, a second housing 212, a third housing 213, and a fourth housing 214 that include first surfaces 211a, 212a, 213a, and 214a, and second surfaces 211b, 212b, 213b, and 214b opposite to the first surfaces 211a, 212a, 213a, and 214a, respectively. In an example embodiment, the plurality of housings 211 through 214 may be arranged in the form of an M×N matrix. In an example, the plurality of housings 211 through 214 may be independently connected to each other by the plurality of hinge structures (e.g., the first hinge structure 321a, the second hinge structure 321b, and the third hinge structure 322 of FIG. 3A). In another example, the plurality of housings 211 through 214 may be integrally formed without a plurality of hinge structures. In another example, some of the plurality of housings 211 through 214 may be integrally formed without a plurality of hinge structures, but the remaining housing(s) may be independently connected to each other through a plurality of hinge structures. A number of housings 211 through 214 is not limited thereto, and the plurality of housings 211 through 214 may include the first housing 211, the second housing 212, and the third housing 213, instead of including the fourth housing 214. In an example, a thickness of the first housing 211 and the second housing 212 may be less than a thickness of the third housing 213 and the fourth housing 214. In another example, the thickness of the first housing 211 and the second housing 212 may be substantially the same as the thickness of the third housing 213 and the fourth housing 214. In another example, the thickness of the first housing 211 and the second housing 212 may be greater than the thickness of the third housing 213 and the fourth housing 214.

The first display 261 may include a first region 261a located on the first surface 211a of the first housing 211, and a second region 261b located on the first surface 212a of the second housing 212, a third region 261c located on the first surface 213a of the third housing 213, and a fourth region 261d located on the first surface 214a of the fourth housing 214. In addition, the first display 261 may include a first flexible region 261e between the first region 261a and the third region 261c, a second flexible region 261g between the first region 261a and the second region 261b, and a third flexible region 261f between the second region 261b and the fourth region 261d. In an example embodiment, there may be no region between the third region 261c and the fourth region 261d of the first display 261. In other words, the third region 261c and the fourth region 261d may not be directly connected to each other. In an example embodiment, there may be no region in a central portion of the first display 261 enclosed by the first flexible region 261e, the second flexible region 261g, and the third flexible region 261f. In other words, the first flexible region 261e, the second flexible region 261g, and the third flexible region 261f may not be directly connected to each other. In another example embodiment, the first flexible region 261e, the second flexible region 261g, and the third flexible region 261f may be integrally formed.

The second display 262 may include a first region 262a located on the second surface 211b of the first housing 211, and a second region 262b located on the second surface 212b of the second housing 212. In addition, the second display 262 may include a flexible region 262c between the first region 262a and the second region 262b. The flexible region 262c may also be referred to as a "fourth flexible region 262c". In an example embodiment, a size of the first display 261 may be greater than a size of the second display 262. In an example embodiment, a region of the second display 262 may be omitted from the second surface 213b of the third housing 213 and the second surface 214b of the fourth housing 214. In an example embodiment, the first region 262a of the second display 262 may be disposed to correspond to the first region 261a and the first flexible region 261e of the first display 261. In an example embodiment, the second region 262b of the second display 262 may be disposed to correspond to the second region 261b and the third flexible region 261f of the first display 261. In an example embodiment, the flexible region 262c of the second display 262 may be disposed to substantially correspond to the second flexible region 261g of the first display 261. In another example embodiment, a region of the second display 262 may be located on the second surface 213b of the third housing 213 and on the second surface 214b of the fourth housing 214. In addition, a flexible region of the second display 262 may be located between the first region 262a of the second display 262 and a region of the second display 262 located on the second surface 213b of the third housing 213, in the second region 262b of the second display 262, and in a region of the second display 262 located on the second surface 214b of the fourth housing 214.

Referring to 3A to 3E, a first display 361 according to an example embodiment may be configured to be folded about each of a first folding axis A1-A1 and a second folding axis A2-A2 that intersects the first folding axis A1-A1.

When the first display 361 is folded about the first folding axis A1-A1, a first flexible region 361e of the first display 361 may be bent about the first folding axis A1-A1 while contacting the first folding axis A1-A1 at the bottom point, and a first region 361a and a third region 361c of the first display 361 may be substantially rotated about the first folding axis A1-A1 while forming circular arc-shaped trajectories. When the first display 361 is folded about the first folding axis A1-A1, a third flexible region 361f of the first display 361 may be bent about the first folding axis A1-A1 while contacting the first folding axis A1-A1 at the bottom point, and a second region 361b and a fourth region 361d of the first display 361 may be rotated about the first folding axis A1-A1 while substantially forming circular arc-shaped trajectories. In an example, trajectories formed by the first region 361a and the third region 361c of the first display 361 and trajectories formed by the second region 361b and the fourth region 361d may be at least a portion of a circumference of a first virtual circle C1 based on a first origin O1 offset by a radius D1 of curvature from the first folding axis A1-A1. In another example, the trajectories formed by the first region 361a and the third region 361c of the first display 361, and the trajectories formed by the second region 361b and the fourth region 361d may be parabolas, exponential curves, and other geometric curves.

In an example embodiment, rotation of the first region 361a and the third region 361c about the first folding axis A1-A1 may be performed independently of rotation of the second region 361b and the fourth region 361d bout the first folding axis A1-A1. The rotation of the first region 361a and the third region 361c about the first folding axis A1-A1 and the rotation of the second region 361b and the fourth region 361d about the first folding axis A1-A1 may indicate that the first display 361 is folded inward about the first folding axis A1-A1.

When the first display 361 is folded about the second folding axis A2-A2, a second flexible region 361g of the first display 361 may be bent about the second folding axis A2-A2 while contacting the second folding axis A2-A2 at the bottom point, and the first region 361a and the second region 361b of the first display 361 may be bent about the second folding axis A2-A2, substantially forming circular arc-shaped trajectories. In an example, trajectories formed by the first region 361a and the second region 361b of the first display 361 may be at least a portion of a circumference of a second virtual circle C2 based on a second origin O2 offset by a radius D2 of curvature from the second folding axis A2-A2. In another example, the trajectories formed by the first region 361a and the second region 361b of the first display 361 may be parabolas, exponential curves, and other geometric curves.

In an example embodiment, rotation of the first region 361a and the second region 361b about the second folding axis A2-A2 may be performed independently of the rotation of the first region 361a and the third region 361c about the first folding axis A1-A1 and the rotation of the second region 361b and the fourth region 361d about the first folding axis A1-A1. The rotation of the first region 361a and the second region 361b about the second folding axis A2-A2 may be understood as folding the first display 261 outward about the second folding axis A2-A2.

In an example embodiment, the first folding axis A1-A1 may be located on the first flexible region 361e and the third flexible region 361f of the first display 361. In an example embodiment, the second folding axis A2-A2 may be located on the second flexible region 361g. In some example embodiments, the first folding axis A1-A1 and the second folding axis A2-A2 may be located on the same plane. In some example embodiments, the first folding axis A1-A1 and the second folding axis A2-A2 may be substantially orthogonal to each other. In an example embodiment, the first display 361 may also be folded about at least one folding axis different from the first folding axis A1-A1 and the second folding axis A2-A2.

A second display 362 according to an example embodiment may be configured to be folded about a third folding axis A3-A3. When the second display 362 is folded about the third folding axis A3-A3, a fourth flexible region 362c of the second display 362 may be bent to wrap around the third folding axis A3-A3, and a first region 362a and a second region 362b of the second display 362 may be rotated about the third folding axis A3-A3 while forming circular arc-shaped trajectories. In an example, trajectories formed by the first region 362a and the second region 362b of the second display 362 may include at least a portion of a circumference of a third virtual circle C3 based on the second origin O2 spaced apart by a radius D3 of curvature from the fourth flexible region 362c. The third virtual circle C3 may include the same second origin O2 as that of the second virtual circle C2. In another example, the trajectories formed by the first region 362a and the second region 362b of the second display 362 may include parabolas, exponential curves, and other geometric curves.

In an example embodiment, rotation of the first region 362a and the second region 362b of the second display 362 about the third folding axis A3-A3 may be performed in conjunction with rotation of the first region 361a and the second region 361b of the first display 361 about the second folding axis A2-A2. The rotation of the first region 362a and the second region 362b about the third folding axis A3-A3 may indicate that the second display 362 is folded inward about the third folding axis A3-A3.

In an example, the first folding axis A1-A1 and the second folding axis A2-A2 may intersect with one another. In another example, the second folding axis A2-A2 and the third folding axis A3-A3 may be parallel to each other. In another example, the first folding axis A1-A1 and the third folding axis A3-A3 may be skew lines. In other words, the first folding axis A1-A1 and the third folding axis A3-A3 may not meet each other.

In an example embodiment, a position of the first origin O1 of the first virtual circle C1 may remain unchanged regardless of whether the first display 361 is folded about the first folding axis A1-A1. In an example embodiment, a position of the origin O2 of the second virtual circle C2 and the third virtual circle C3 may remain unchanged regardless of whether the first display 361 and the second display 362 are folded about the second folding axis A2-A2.

In an example embodiment, the first display 361 may have a neutral surface. When a bending force is applied to the first display 361 according to folding of the first display 361, one side of the first display 361 may extend and the other side may contract with respect to the neutral surface of the first display 361, and the neutral surface of the first display 361 may not extend and contract. In other words, it is understood that the first folding axes A1-A1 and the second folding axes A2-A2, about which the first display 361 is to fold or unfold, are located on the first display 361. The second display 362 may not have a neutral surface. In other words, it may be understood that the third folding axis A3-A3, about which the second display 362 is to fold or unfold, is located outside the second display 362.

The electronic device 301 according to an example embodiment may include the first hinge structure 321a, the second hinge structure 321b, and the third hinge structure 322.

The first hinge structure 321a may connect a first housing 311 and a third housing 313 and may fold the first housing 311 and the third housing 313 about the first folding axis A1-A1. The first flexible region 361e of the first display 361 may be located above the first hinge structure 321a. In the first hinge structure 321a, the first flexible region 361e of the first display 361 may be bent inward about the first folding axis A1-A1 while contacting with the first folding axis A1-A1 at the bottom point.

The second hinge structure 321b may connect a second housing 312 and a fourth housing 314 and may fold the second housing 312 and the fourth housing 314 about the first folding axis A1-A1. The third flexible region 361f of the first display 361 may be located above the second hinge structure 321b. In the second hinge structure 321b, the third flexible region 361f of the first display 361 may be bent inward about the first folding axis A1-A1 while contacting with the first folding axis A1-A1 at the bottom point.

The third hinge structure 322 may connect the first housing 311 and the second housing 312, and may fold the first housing 311 and the second housing 312 about the second folding axis A2-A2. When viewed from one direction (e.g., an X direction), the second flexible region 361g of the first display 361 may be located above the third hinge structure 322. When viewed in another direction (e.g., a −X direction), the fourth flexible region 362c of the second display 362 may be located above the third hinge structure 322. In the third hinge structure 322, the second flexible region 361g of the first display 361 may be bent outward about the second folding axis A2-A2 while contacting the second folding axis A2-A2 at the bottom point, and the fourth flexible region 362c of the second display 362 may be bent inward about third folding axis A3-A3 to wrap around the third folding axis A3-A3.

In an example, the first hinge structure 321a and the second hinge structure 321b may have substantially the same structure. In another example, the first hinge structure 321a and the second hinge structure 321b may have a structure different from that of the third hinge structure 322. In an example, the first hinge structure 321a, the second hinge structure 321b, and the third hinge structure 322 may not be directly connected to each other and may operate independently. In another example, the first hinge structure 321a, the second hinge structure 321b, and the third hinge structure 322 may be integrally formed.

Referring to FIGS. 3D through 3I, the electronic device 301 according to various example embodiments may have a structure to compensate for a length of the second display 362, to prevent the second display 362 from being creased or tensioned when a bending force is applied to the second display 362 due to folding of the second display 362. The electronic device 301 may include a first elastic body 331a, a first plate 332a, a first shaft 333a, a second elastic body 331b, a second plate 332b, and a second shaft 333b.

Figure 3D:
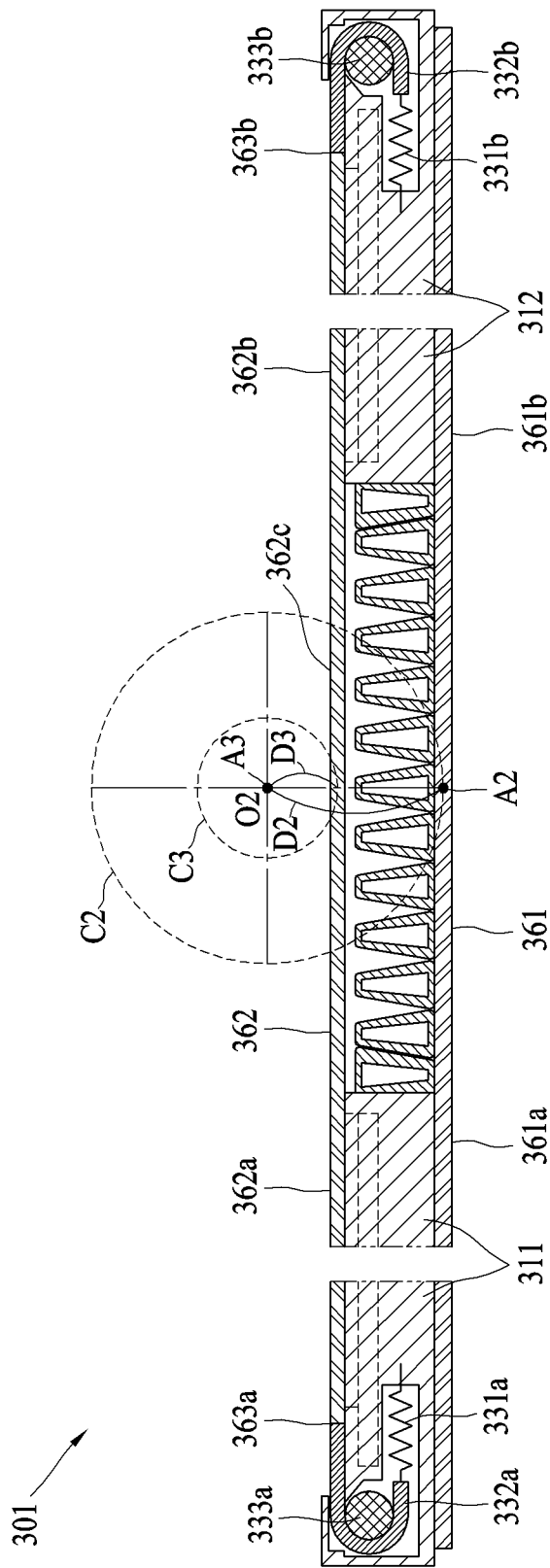
FIG. 3D is a cross-sectional view of the electronic device of FIG. 3A in a state in which the first display is not folded about a second folding axis and a second display is not folded about a third folding axis, as viewed in a Z direction.
Figure 3E:
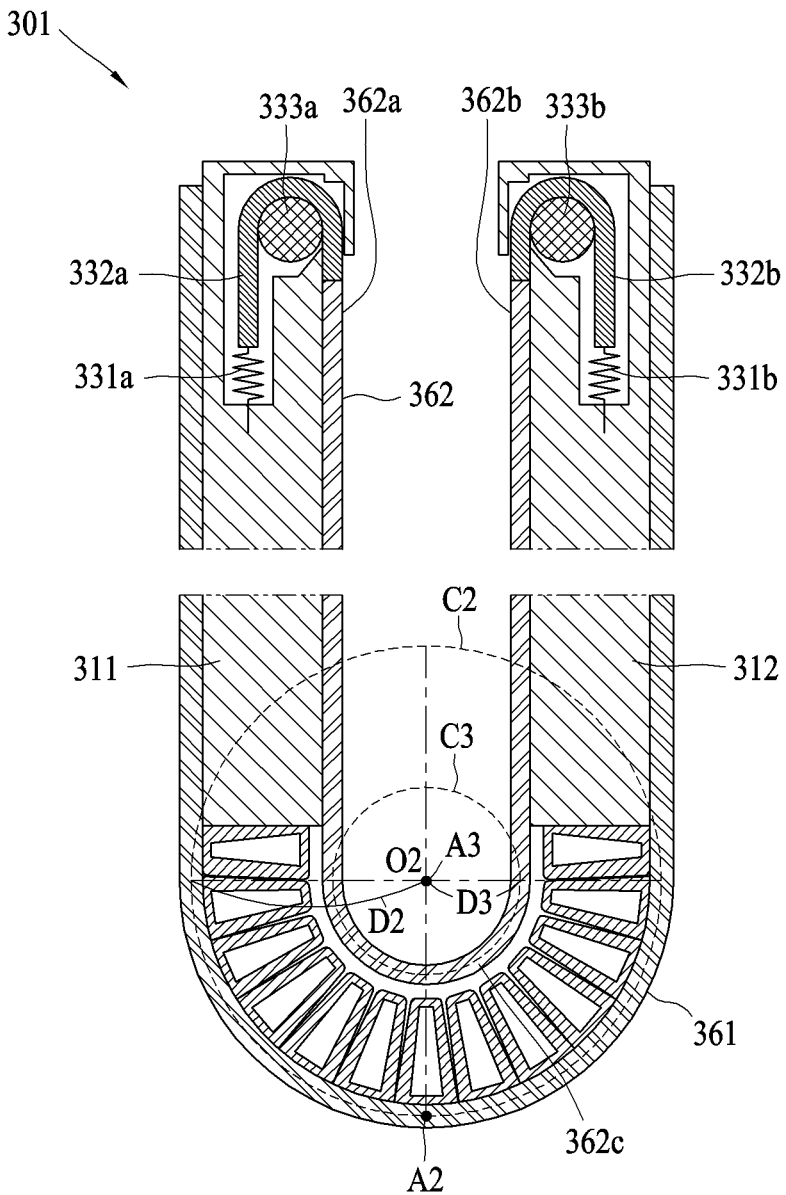
FIG. 3E is a cross-sectional view of the electronic device of FIG. 3A in a state in which the first display is folded about the second folding axis and the second display is folded about the third folding axis, as viewed in the Z direction.
Figure 3F:
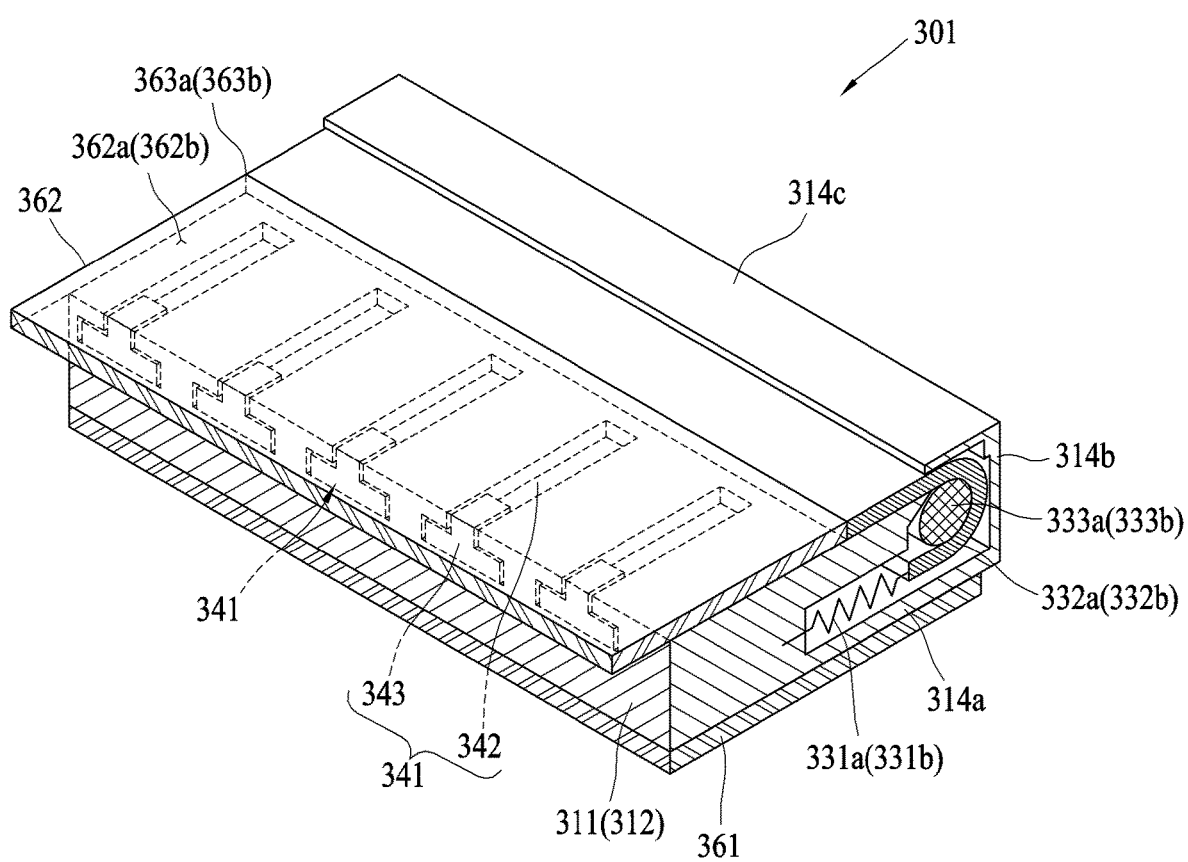
FIG. 3F is a perspective view of an electronic device in a state in which an elastic body is stretched according to an example embodiment.
Figure 3G:
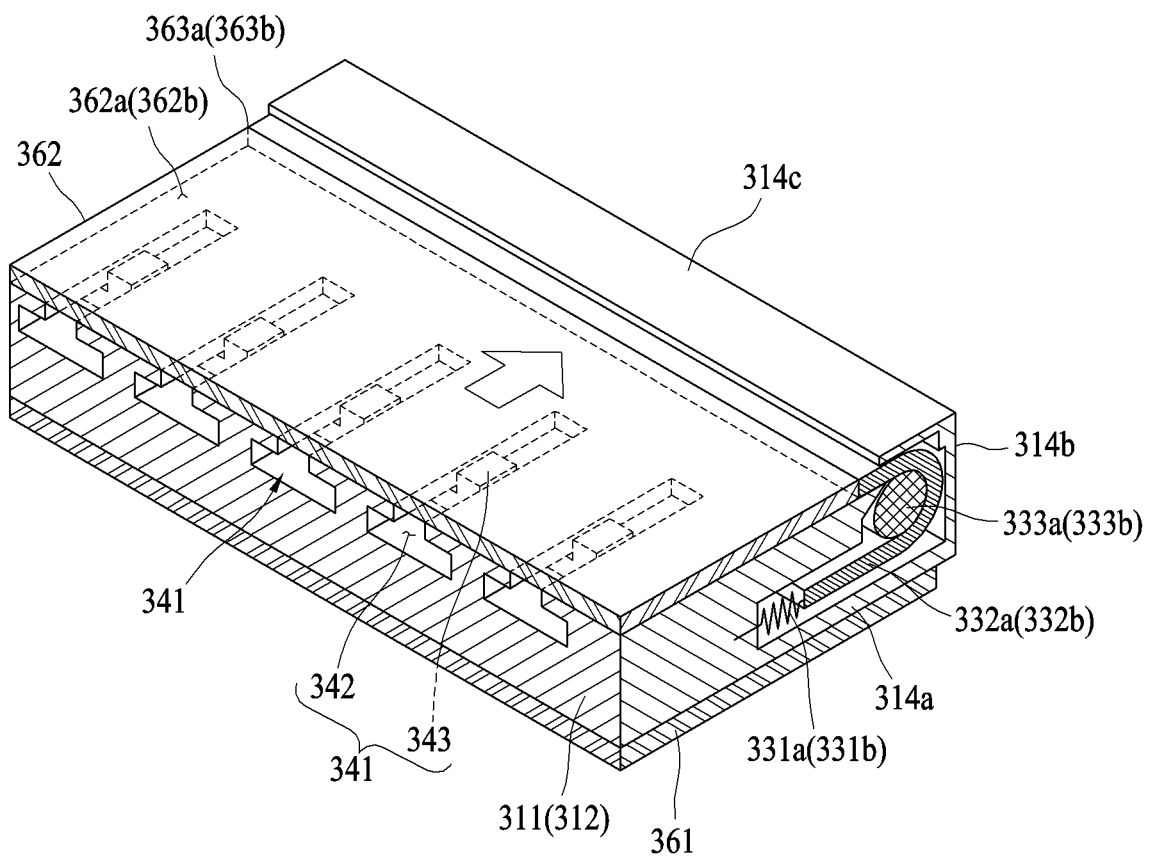
FIG. 3G is a perspective view of an electronic device in a state in which an elastic body is compressed according to an example embodiment.
Figure 3H:
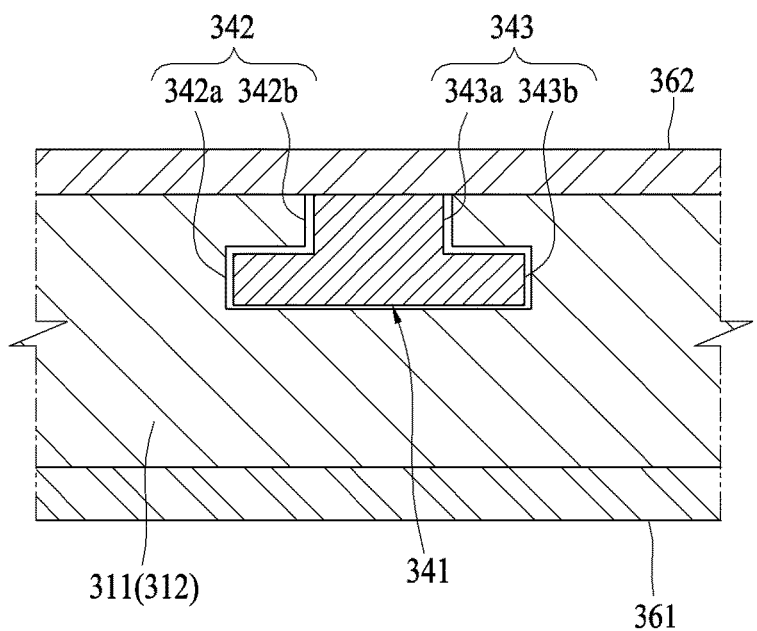
FIG. 3H is a cross-sectional view of a guide of an electronic device according to an example embodiment.

The first elastic body 331a may connect the first housing 311 and an end portion 363a of the first region 362a of the second display 362. Here, connecting the first housing 311 and the second display 362 by the first elastic body 331a may indicate that the first plate 332a is interposed between the first elastic body 331a and the second display 362, to indirectly connect the first housing 311 and the second display 362 as shown in FIG. 3D, and also indicate that the first housing 311 and the second display 362 are directly connected. The first elastic body 331a may have a first length when the second display 362 is in an unfolded state as shown in FIG. 3D, and may have a second length less than the first length when the second display 362 is in a folded state as shown in FIG. 3E. In other words, the first elastic body 331a may be stretched and compressed between a folded state and an unfolded state of the second display 362. The second elastic body 331b may connect the second housing 312 and an end portion 363b of the second region 362b of the second display 362. Here, connecting the second housing 312 and the second display 362 by the second elastic body 331b may indicate that the second plate 332b is interposed between the second elastic body 331b and the second display 362 to indirectly connect the second housing 312 and the second display 362 as shown in FIG. 3D, and that the second housing 312 and the second display 362 are directly connected. The second elastic body 331b may have a third length when the second display 362 is in the unfolded state as shown in FIG. 3D, and may have a fourth length less than the third length when the second display 362 is in the folded state as shown in FIG. 3E. In other words, the second elastic body 331b may be stretched and be compressed between the folded state and the unfolded state of the second display 362. In an example, the first elastic body 331a and the second elastic body 331b may be formed of a spring or other rigid materials to enable the utilized elastic behavior.

The first plate 332a may connect the first elastic body 331a and the end portion 363a of the first region 362a of the second display 362, and may transmit a force between the first elastic body 331a and the second display 362. The first plate 332a may be disposed between an end surface 314b of the first housing 311 and the end portion 363a of the first region 362a of the second display 362, and may compensate for a distance between the first housing 311 and the second display 362. The second plate 332b may connect the second elastic body 331b and the end portion 363b of the second region 362b of the second display 362, and may transmit a force between the second elastic body 331b and the second display 362. The second plate 332b may be disposed between an end surface 314b of the second housing 312 and the end portion 363b of the second region 362b of the second display 362, and may compensate for a distance between the second housing 312 and the second display 362.

In an example, the first plate 332a and the second plate 332b may be formed of a soft material. In another example, the first plate 332a and the second plate 332b may also be formed of a rigid material.

The first shaft 333a may contact the first plate 332a to guide the first plate 332a. In an example, the first plate 332a may roll along an outer circumferential surface of the first shaft 333a. In another example, the first plate 332a may linearly move along the outer circumferential surface of the first shaft 333a. The first shaft 333a may be rotatably located in the first housing 312. The second shaft 333b may contact the second plate 332b to guide the second plate 332b. In an example, the second plate 332b may roll along an outer circumferential surface of the second shaft 333b. In another example, the second plate 332b may linearly move along the outer circumferential surface of the second shaft 333b.

In an example embodiment, the first elastic body 331a, the first plate 332a, and the first shaft 333a may be disposed symmetrically to the second elastic body 331b, the second plate 332b and the second shaft 333b, with respect to a virtual plane including the second folding axis A2-A2 and the third folding axis A3-A3.

In an example embodiment, the first housing 311 and the second housing 312 may each include an accommodating portion 334 accommodating the elastic body 331a, 331b, the plate 332a, 332b, and the shaft 333a, 333b. The accommodating portion 334 may include a first accommodating portion 334a that extends along the first region 362a or the second region 362b of the second display 362 and in which the elastic body 331a, 331b and the plate 332a, 332b substantially linearly move, a second accommodating portion 334b that is connected to the first accommodating portion 334a, that extends in a direction crossing a direction in which the first accommodating portion 334a extends and in which the plate 332a, 332b substantially rolls, and a third accommodating portion 334c that is connected to the second accommodating portion 334b, that extends toward the end portion 363a of the first region 362a of the second display 362 and the end portion 363b of the second region 362b in a direction opposite to the direction in which the first accommodating portion 334a extends, and in which the plate 332a, 332b substantially linearly moves. The first accommodating portion 334a may include a cavity formed between a first body 314a in contact with the first display 361 and a second body 315a in contact with the second display 362, and may accommodate a portion of the plate 332a, 332b, and the elastic body 331a, 331b. The second body 315a may extend toward the end surfaces 314b of the first housing 311 and the second housing 312, beyond the first body 314a. The second accommodating portion 334b may include a cavity formed between the first body 314a, the second body 315a, and the end surface 314b connected to the second body 315a and extending in a direction crossing the first body 314a, and may accommodate the shaft 333a, 333b and a portion of the plate 332a, 332b. The third accommodating portion 334c may include a cavity formed between a protrusion 315b protruding from at least a portion of the first body 314a toward the end surface 314b, a portion of the end surface 314b and an edge surface 314c connected to the end surface 314b and extending in a direction opposite to a direction in which the first body 314a extends, and may accommodate a portion of the plate 332a, 332b. In an example embodiment, the protrusion 315b may support a portion of one surface of the plate 332a, 332b. In an example embodiment, the protrusion 315b may be tapered in a protrusion direction. In some example embodiments, the protrusion 315b may guide at least a portion of the outer circumferential surface of the shaft 333a, 333b. In an example embodiment, the edge surface 314c may guide a portion of another surface of the plate 332a, 332b. In an example embodiment, the plate 332a, 332b may be located between the protrusion 315b and the edge surface 314c.

In an example embodiment, at least one of the first housing 311 and the second housing 312 may include a guide 341 configured to guide the second display 362 so that the second display 362 is slidable. A plurality of guides 341 may be installed in the first housing 311 and/or the second housing 312 in a direction crossing a direction in which the second display 362 slides. The guide 341 may include a longitudinal recess 342, and a slider 343 that is slidably received in the longitudinal recess 342 and that is configured to support the first region 362a and/or the second region 362b of the second display 362. The longitudinal recess 342 may include a first longitudinal recess 342a having a first width, and a second longitudinal recess 342b that is connected to the first longitudinal recess 342a and that has a second width. In an example, the first width may be greater than the second width. In another example, the first width may be less than the second width. In another example, the first width and the second width may be substantially the same. The slider 343 may include a first block 343a that is received in the first longitudinal recess 342a and slidable along the first longitudinal recess 342a, and a second block 343b that is connected to the first block 343a, that supports the second display 362, received in the second longitudinal recess 342b and slidable along the second longitudinal recess 342b.

According to an operation of the electronic device 301, in an example, when a state of the second display 362 changes from the unfolded state (e.g., FIG. 3D) to the folded state (e.g., FIG. 3E), the fourth flexible region 362c may be bent so as to wrap around the third folding axis A3-A3. The first region 362a and the second region 362b may substantially face each other, rotate about the third folding axis A3-A3, be supported by the slider 343, and slide toward the end surface 341b of each of the first housing 311 and the second region 312. At least a portion of the plate 332a, 332b may enter the accommodating portion 334 via guidance by the shaft 333a, 333b, and the elastic body 331a, 331b may be compressed. In another example, when the state of the second display 362 changes from the folded state (e.g., FIG. 3E) to the unfolded state (e.g., FIG. 3D), the fourth flexible region 362c may be substantially flat. The first region 362a and the second region 362*b* may rotate about the third folding axis A3-A3 while moving away from each other, be supported by the slider 343, and slide further away from the end surface 314*b* of each of the first housing 311 and the second housing 312. At least a portion of the plate 332*a*, 332*b* may be pulled out of the accommodating portion 334 via guidance by the shaft 333*a*, 333*b*, and the elastic body 331*a*, 331*b* may extend.

Figure 3I:
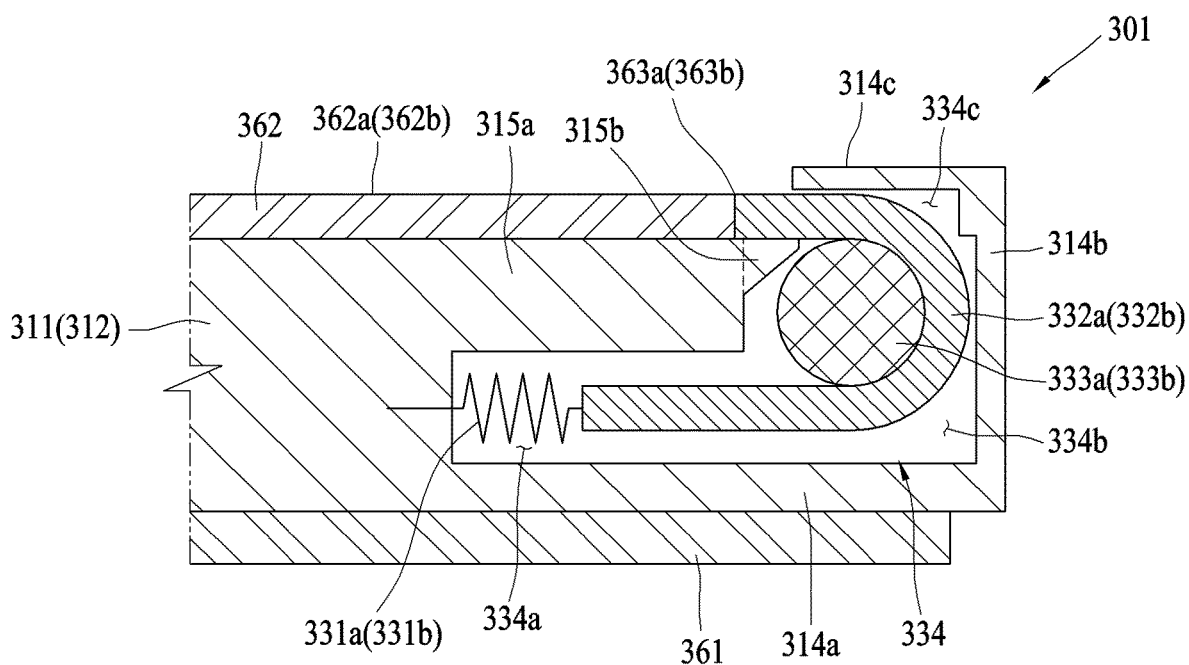
FIG. 3I is a cross-sectional view of an example of an electronic device including an elastic body according to an example embodiment.
Figure 4:
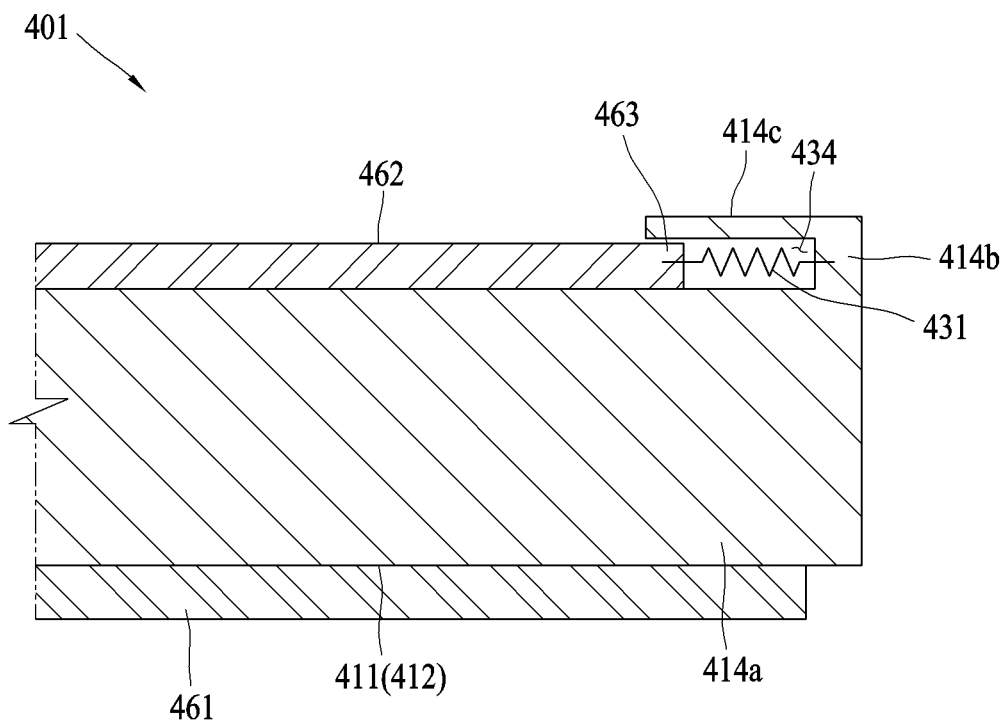
FIG. 4 is a cross-sectional view of another example of an electronic device including an elastic body according to an example embodiment.

Referring to FIG. 4, an electronic device 401 according to an example embodiment may also compensate for a length of a second display 462 folded using an elastic body 431 (e.g., the elastic bodies 331*a* and 331*b* of FIG. 3I) without the plates 332*a* and 332*b* and the shafts 333*a* and 333*b* of the electronic device 301 shown in FIG. 3I. A first display 461 and a second display 462 may contact both sides of a body 414*a* of a first housing 411 and a second housing 412. The elastic body 431 may be accommodated in an accommodating portion 434 that is formed by a body 414*a*, an end surface 414*b* extending onto the body 414*a*, and an edge surface 414*c* extending in a direction crossing a direction in which the end surface 414*b* extends. In an example embodiment, the elastic body 431 and the second display 462 may be located on the same plane on the body 414*a*. In an example embodiment, an end portion 463 of the second display 462 may be obscured by the edge surface 414*c*.

Figure 5:
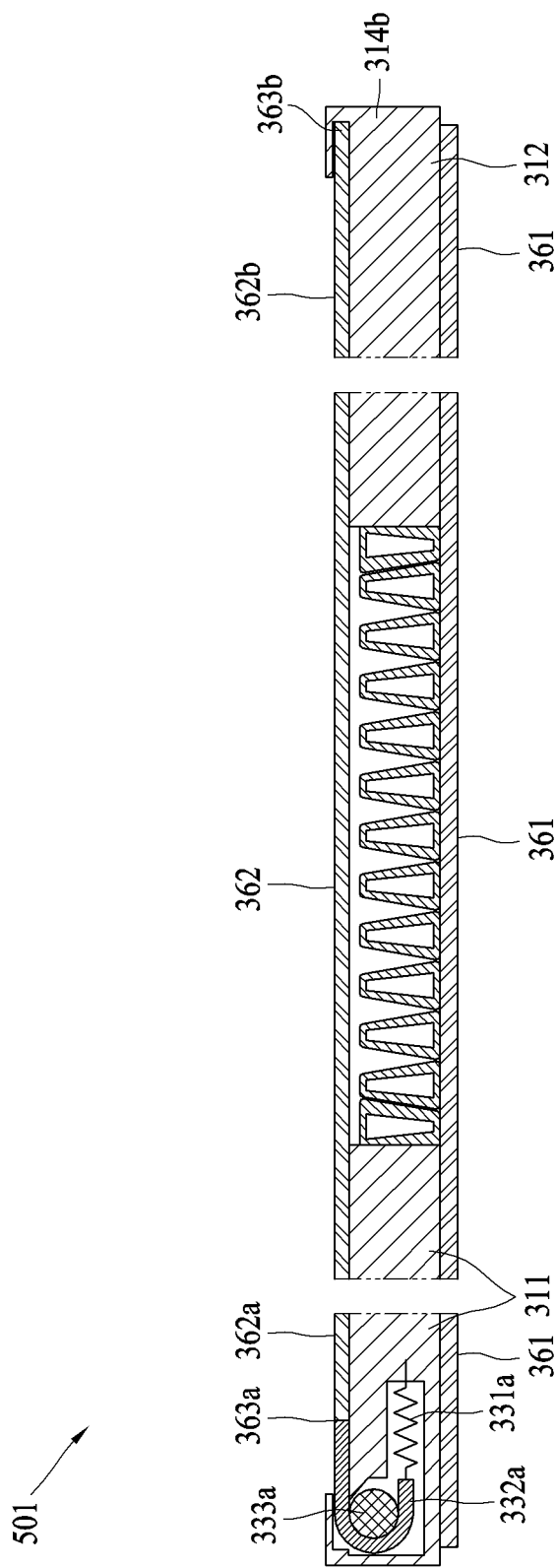
FIG. 5 is a cross-sectional view of another example of an electronic device including an elastic body according to an example embodiment.

Referring to FIG. 5, unlike the electronic device 301 of FIG. 3D, an electronic device 501 according to an example embodiment may also include a single elastic body 331*a* that connects the end portion 363*a* of the first region 362*a* of the second display 362 and one housing (e.g., the first housing 311). Here, the elastic body 331*a*, the plate 332*a*, and the shaft 333*a* may be located in one housing (e.g., the first housing 311) and not located in the other housing (e.g., the second housing 312). The end portion 363*b* of the second region 362*b* of the second display 362 may be fixed on the end surface 314*b* of a housing (e.g., the second housing 312) in which the elastic body 331*a*, the plate 332*a*, and the shaft 333*a* are absent.

Figure 6A:
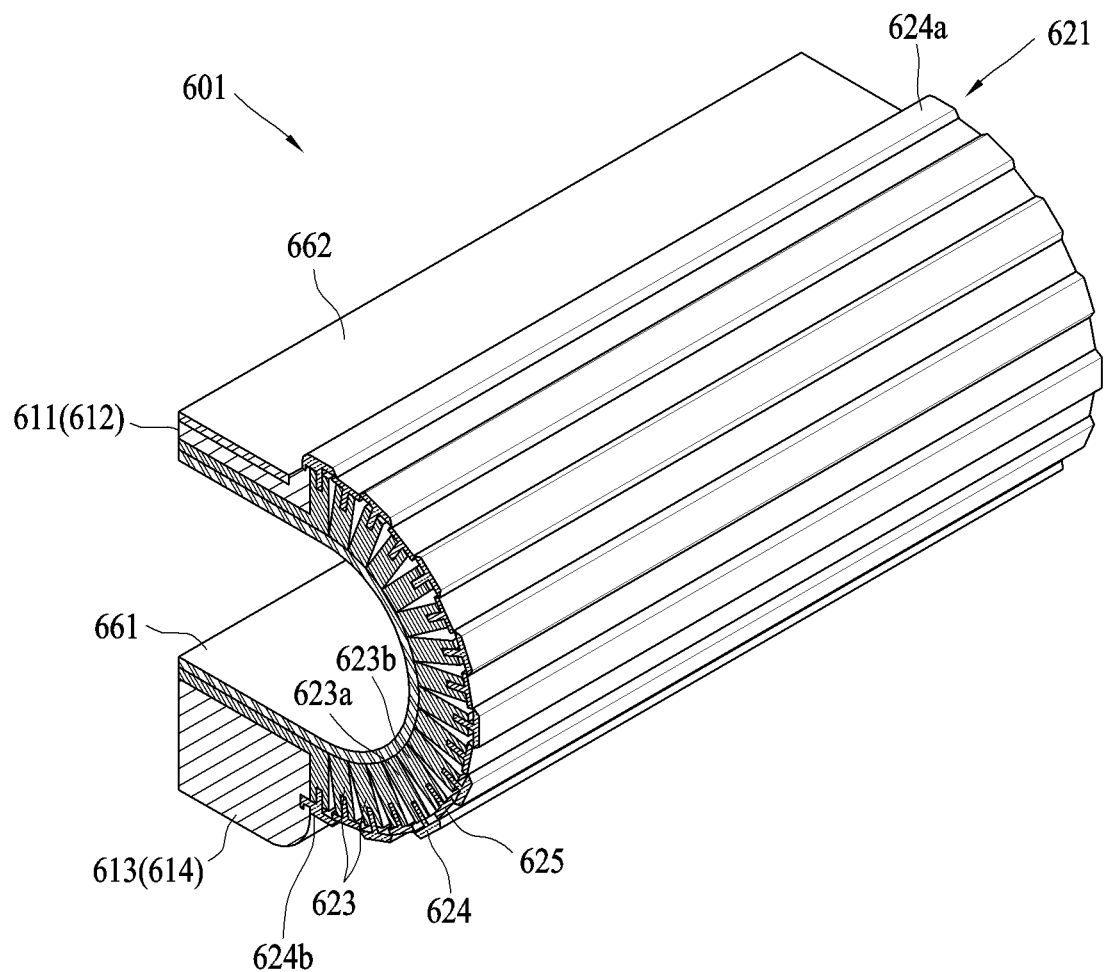
FIG. 6A is a perspective view of a first hinge structure of an electronic device according to an example embodiment.

Referring to FIG. 6A, a hinge structure 621 (e.g., the first hinge structure 321*a* and/or the second hinge structure 321*b* of FIG. 3A) of an electronic device 601 according to an example embodiment may include a plurality of hinge sectors 623 arranged along a first display 661 between a first housing 611 (or a second housing 612) and a third housing 613 (or a fourth housing 614), a plurality of first connectors 624 located in a first set of hinge sectors 623*a* among the plurality of hinge sectors 623, and a plurality of second connectors 625 located in a second set of hinge sectors 623*b* among the plurality of hinge sectors 623 and connected to the plurality of first connectors 624. A pair of first connectors 624*a* and 624*b* closest to each of the first housing 611 (or the second housing 612) and the third housing 613 (or the fourth housing 614) from among the plurality of first connectors 624 may be connected to the first housing 611 (or the second housing 612) and the third housing 613 (or the fourth housing 614). In an example embodiment, the plurality of first connectors 624 and the plurality of second connectors 625 may be alternately located in an arrangement direction of the plurality of hinge sectors 623. In an example, the plurality of second connectors 625 may be located further outward than the plurality of first connectors 624. In another example, the plurality of second connectors 625 may be located further inward than the plurality of first connectors 624. In an example embodiment, the plurality of first connectors 624 and the plurality of second connectors 625 may be formed in the shape of a strip.

Figure 6B:
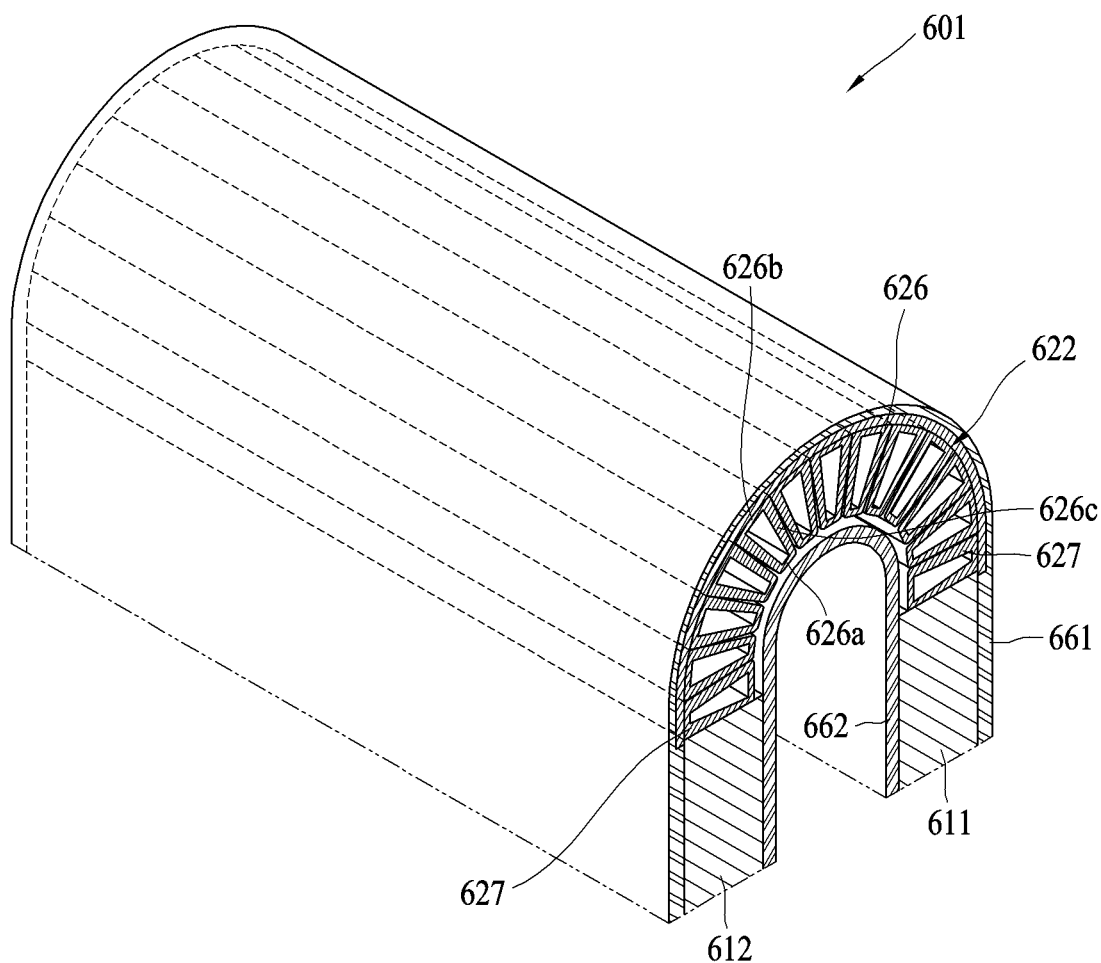
FIG. 6B is a perspective view of a second hinge structure of an electronic device according to an example embodiment.

Referring to FIG. 6B, a hinge structure 622 (e.g., the third hinge structure 322 of FIG. 3A) of the electronic device 601 according to an example embodiment may include a plurality of cell structures 626 located between the first display 661 and the second display 662 and arranged between the first housing 611 and the second housing 612. The plurality of cell structures 626 may include a first surface 626*a* adjacent to the second display 662, a second surface 626*b* adjacent to the first display 661, and a pair of third surfaces 626*c* that connect the first surface 626*a* and the second surface 626*b*. The plurality of cell structures 626 may include a void defined by the first surface 626*a*, the second surface 626*b*, and the third surfaces 626*c*. An area of the first surface 626*a* may be less than an area of the second surface 626*b*. In a pair of cell structures 627 adjacent to the first housing 611 and the second housing 612 among the plurality of cell structures 626, a first surface 626*a* may be adjacent to the first display 661 and a second surface 626*b* may be adjacent to the second display 662, unlike the other cell structures 626.

Figure 7:
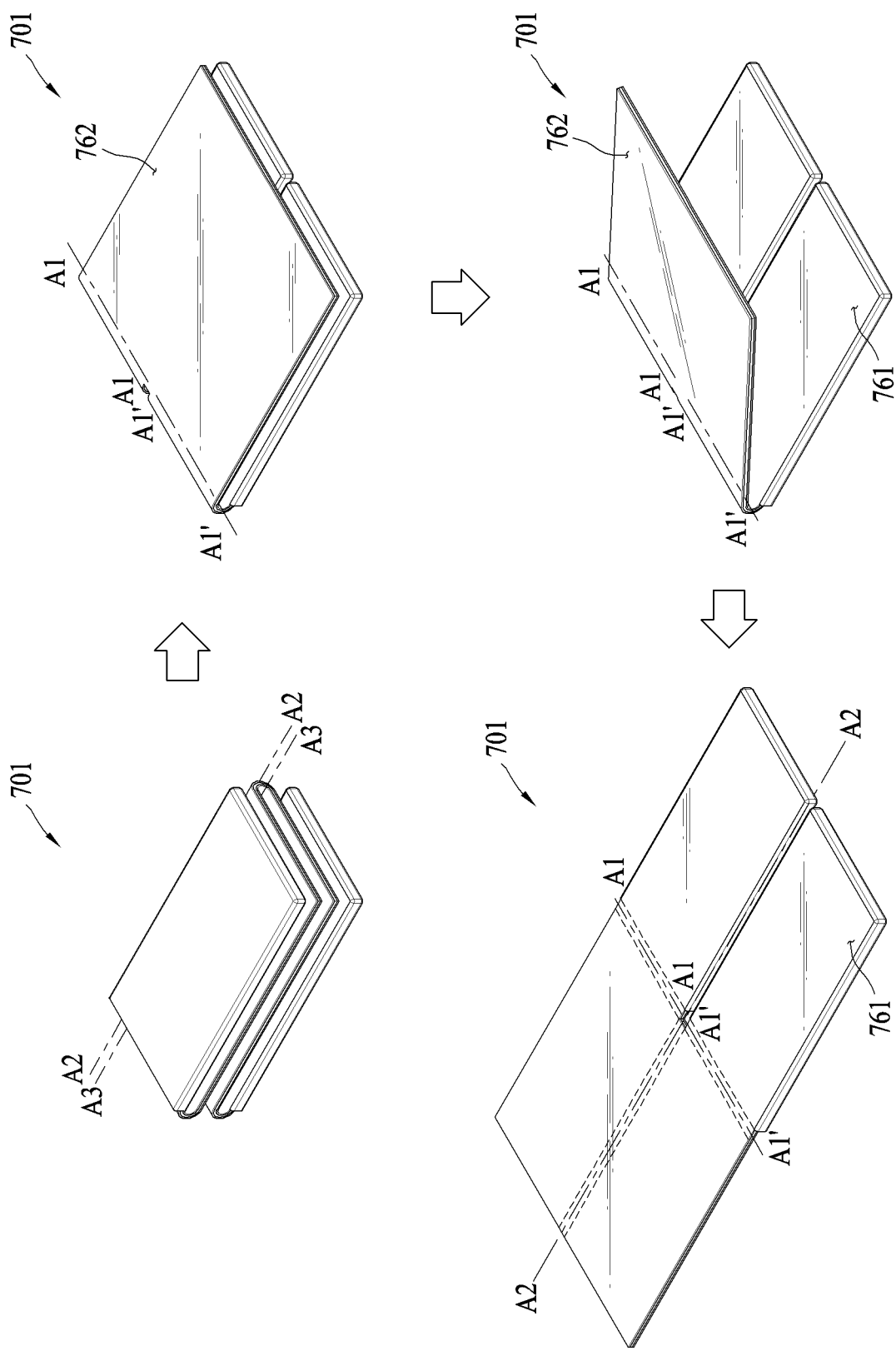
FIG. 7 is a diagram illustrating a first operation of an electronic device according to an example embodiment.

An operation of an electronic device 701 according to an example embodiment is described with reference to FIG. 7. The electronic device 701 may take a compact form in which a first display 761 is folded inward about a first folding axis A1-A1, in which a second display 762 is folded outward about a second folding axis A2-A2, and in which the second display 762 is folded inward about a third folding axis A3-A3. In the electronic device 701 in the compact form as described above, the first display 761 may be unfolded about the second folding axis A2-A2, and at the same time, the second display 762 may be unfolded about the third folding axis A3-A3. Subsequently, the electronic device 701 may take a form of a tablet in which the first display 761 is unfolded about the first folding axis A1-A1, and an area in which the electronic device 701 may display information increases by about a factor of two. Furthermore, the area in which the electronic device 701 may display information may increase by a factor of six in the form of the tablet, compared to the compact form, based on an area of one region of the first display 761.

Figure 8:
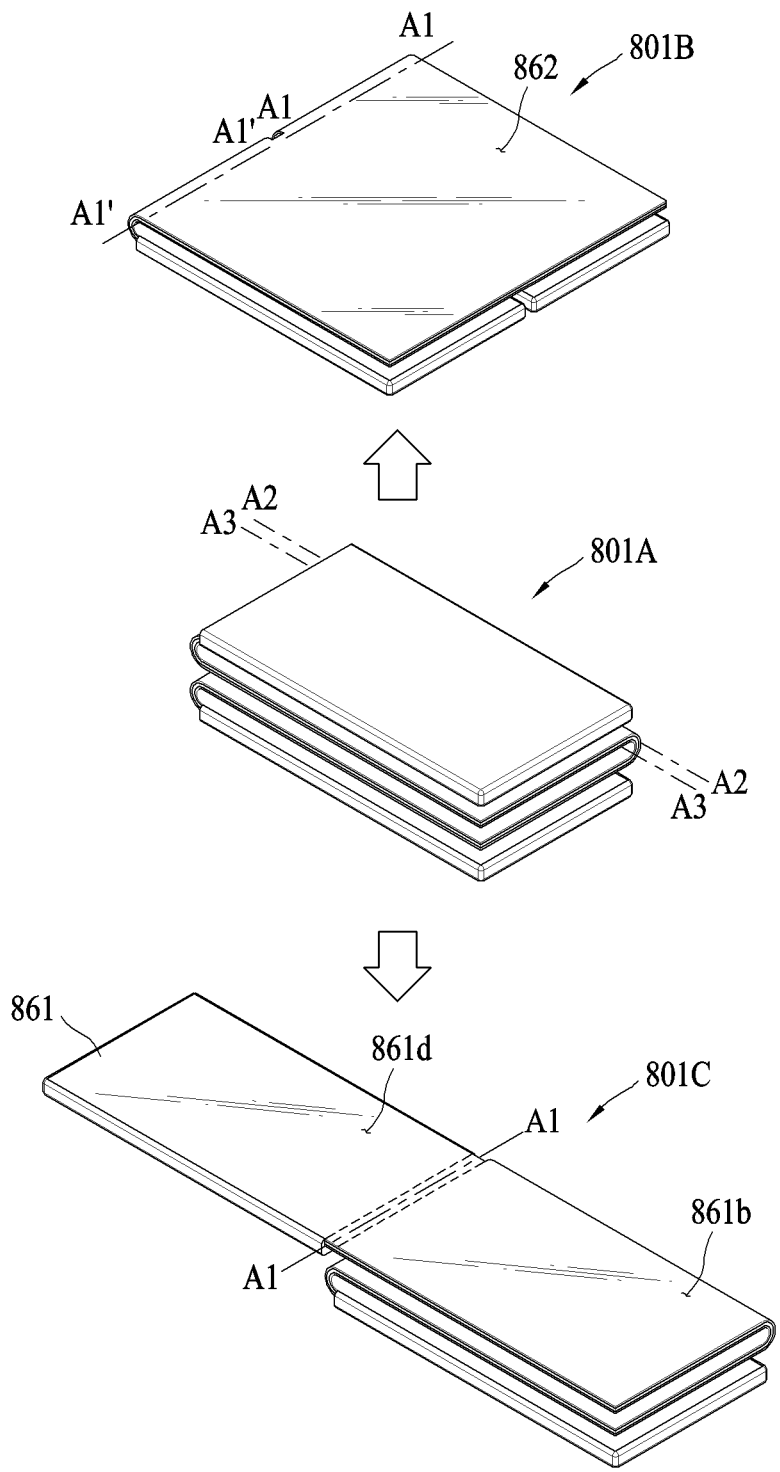
FIG. 8 is a diagram illustrating a second operation of an electronic device according to an example embodiment.

Operations of electronic devices 801A, 801B and 801C according to an example embodiment are described with reference to FIG. 8. In an example, a form of the electronic device 801A in a fully folded state (e.g., a compact form) may be changed to a form of the electronic device 801B in a state of being unfolded about a second folding axis A2-A2 and a third folding axis A3-A3 by one motion of a user. In another example, the folded form of the electronic device 801A may be changed to an open, unfolded form of the electronic device 801C by unfolding about a first folding axis A1-A1 via one motion of a user. In this example, while the form of the electronic device 801A is transitioning to the form of the electronic device 801C, a second region 861*b* and a fourth region 861*d* of a first display 861 may move away from each other.

Figure 9:
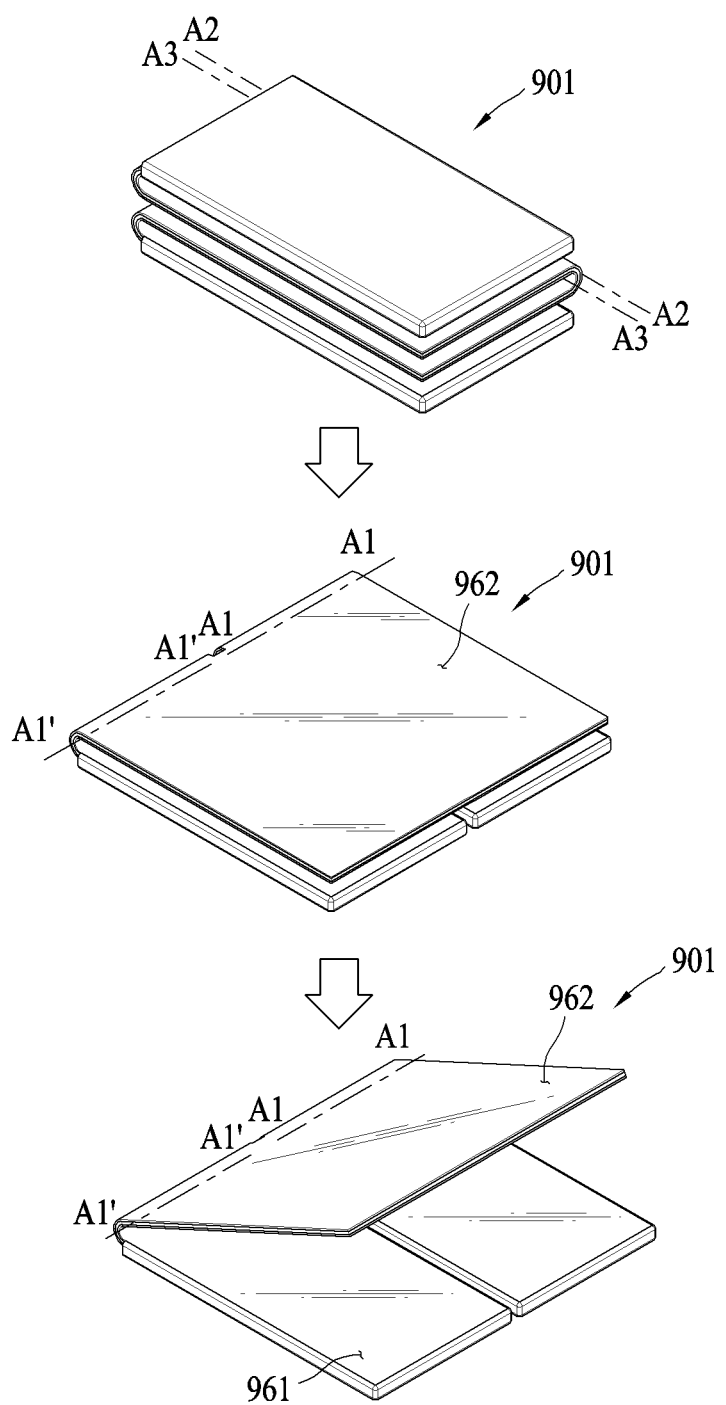
FIG. 9 is a diagram illustrating a third operation of an electronic device according to an example embodiment.

An operation of an electronic device 901 according to an example embodiment is described with reference to FIG. 9. In a state in which the electronic device 901 is fully folded, a first display 961 and a second display 962 may be unfolded about a second folding axis A2-A2 and a third folding axis A3-A3, respectively, by one motion of a user. Subsequently, the first display 961 may be unfolded about first folding axes A1-A1 and A1'-A1' by one motion of the user.

Figure 10:
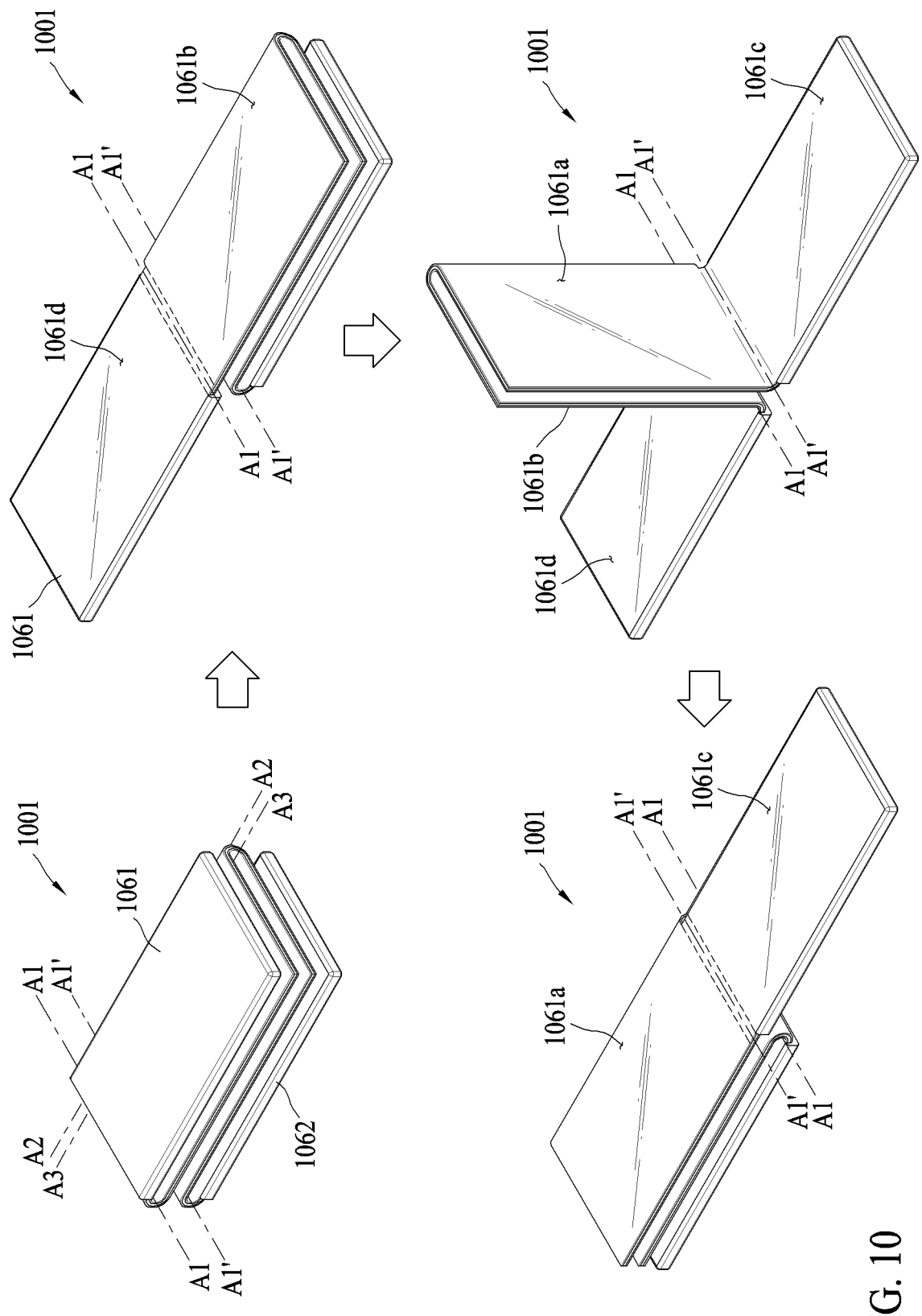
FIG. 10 is a diagram illustrating a fourth operation of an electronic device according to an example embodiment.

An operation of an electronic device 1001 according to an example embodiment is described with reference to FIG. 10. The electronic device 1001 may be disposed in a compact form in which a first display 1061 is folded inward about first folding axes A1-A1 and A1'-A1', and folded outward about a second folding axis A2-A2 and in which a second display 1062 is folded inward about a third folding axis A3-A3. The electronic device 1001 in the compact form, as described above, may be unfolded about the first folding axis A1-A1 while a fourth region 1061*d* of the first display 1061 is moving away from a second region 1061*b*. Subsequently, the second region 1061*b* of the first display 1061 may be folded about the first folding axis A1-A1 and the first region 1061*a* may be unfolded about the first folding axis A1'-A1' while moving away from a third region 1061*c* of the first display 1061, so that the electronic device 1001 may take a form in which the third region 1061*c* and the fourth region 1061*d* of the first display 1061 are disposed on the bottom and in which the first region 1061*a* and the second region 1061*b* are substantially perpendicular to the bottom. Subsequently, the electronic device 1001 may take a form in which the second region 1061*b* of the first display 1061 is folded about the first folding axis A1-A1 so that the second region 1061*b* faces the fourth region 1061*d*. Based on the change in the form of the electronic device 1001 as described above, unlike the electronic device 701 of FIG. 7, the first display 1061 may not be fully unfolded and the plurality of regions 1061*a*, 1061*b*, 1061*c*, and 1061*d* of the first display 1061 may be used.

Figure 11:
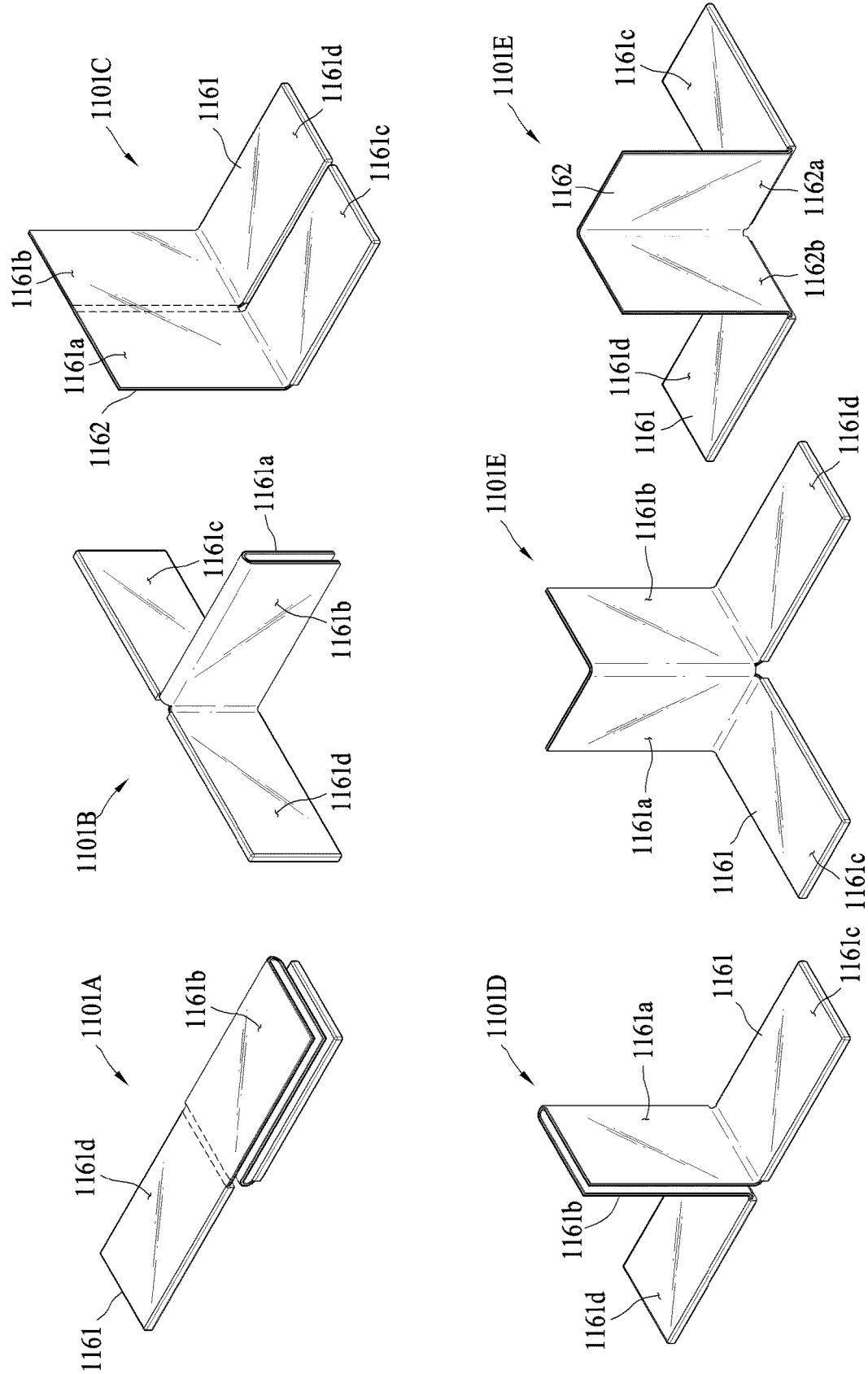
FIG. 11 is a diagram illustrating a state of an electronic device according to various example embodiments.

Referring to FIG. 11, electronic devices 1101A, 1101B, 1101C, 1101D, and 1101E according to various example embodiments may be used in various forms.

The electronic device 1101A according to an example embodiment may be implemented in a form in which a fourth region 1161*d* of a first display 1161 is unfolded from a second region 1161*b*. A user may identify information (e.g., listed text) displayed on the fourth region 1161*d* and the second region 1161*b*. In some example embodiments, a user may also acquire an image of a panoramic view using a camera module (e.g., the camera module 180 of FIG. 1) in the electronic device 1101A in the above form.

The electronic device 1101B according to an example embodiment may be implemented in a form in which a first region 1161*a*, a second region 1161*b*, a third region 1161*c*, and a fourth region 1161*d* of a first display 1161 are perpendicular to the bottom in a state in which the third region 1161*c* and the fourth region 1161*d* are substantially perpendicular to the first region 1161*a* and the second region 1161*b*, respectively.

The electronic device 1101C according to an example embodiment may be configured in a form in which a third region 1161*c* and a fourth region 1161*d* of a first display 1161 are placed on the bottom and in which a first region 1161*a* and a second region 1161*b* of the first display 1161 are substantially perpendicular to the bottom. A user may use the third region 1161*c* and the fourth region 1161*d* of the first display 1161 as an input region (e.g., by displaying soft-touch controls and/or inputs, in tandem with the input module 150 of FIG. 1, mimicking a keyboard and touchpad in a traditional laptop), and may use the first region 1161*a* and the second region 1161*b* as a display region (e.g., as a partition of the display module 160 of FIG. 1, mimicking a display in traditional laptop). In some example embodiments, a user may share information with others through a second display 1162 opposite the first display 1161 while mainly using the first display 1161.

The electronic device 1101D according to an example embodiment may be implemented in a form in which a third region 1161*c* and a fourth region 1161*d* of a first display 1161 are placed on the bottom, and in which the third region 1161*c* and the fourth region 1161*d* are substantially perpendicular to a first region 1161*a* and a second region 1161*b* of the first display 1161, respectively.

The electronic device 1101E according to an example embodiment may be implemented in a form in which a first region 1161*a* and a second region 1161*b* of a first display 1161 are folded outward, in which the first region 1161*a* and a third region 1161*c* are folded inward, in which the second region 1161*b* and a fourth region 1161*d* are folded inward, and in which a first region 1162*a* and a second region 1162*b* of a second display 1162 are folded inward.

The electronic devices 1101A, 1101B, 1101C, 1101D, and 1101E may be implemented in various forms as described above, but are not limited thereto, and may be implemented in a wider variety of forms according to a need of a user, although not shown. The electronic devices 1101A, 1101B, 1101C, 1101D, and 1101E may be folded/unfolded in both directions by one motion of a user, and an area on which information may be displayed may increase.

Figure 12A:
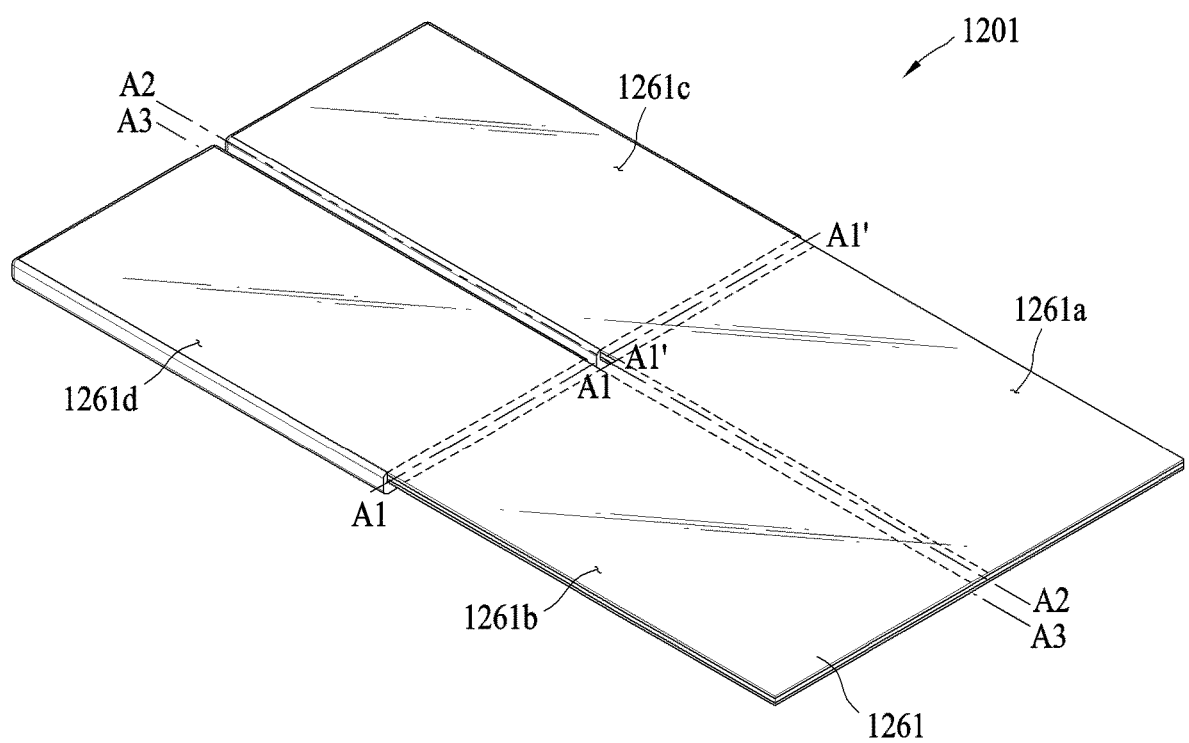
FIG. 12A is a diagram illustrating a first form of an electronic device in a fifth operation according to an example embodiment.
Figure 12B:
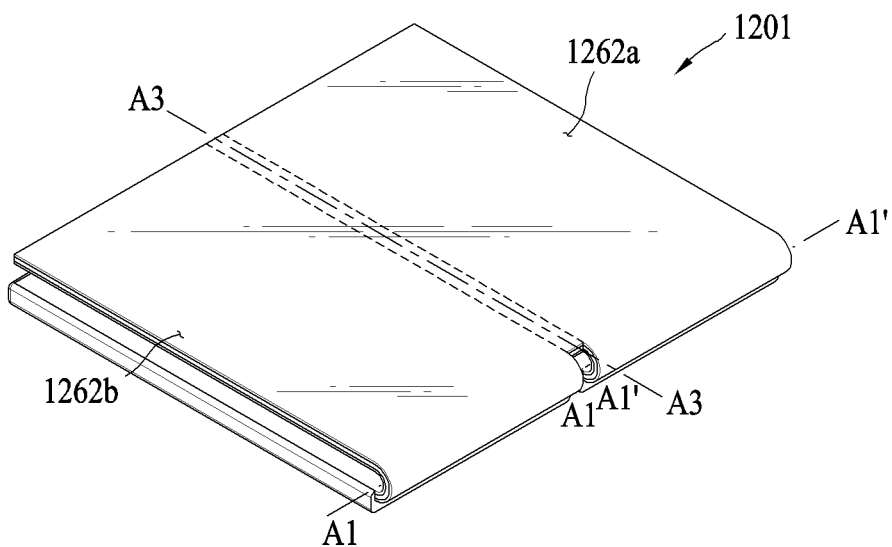
FIG. 12B is a diagram illustrating a second form of the electronic device of FIG. 12A in the fifth operation according to an example embodiment.
Figure 12C:
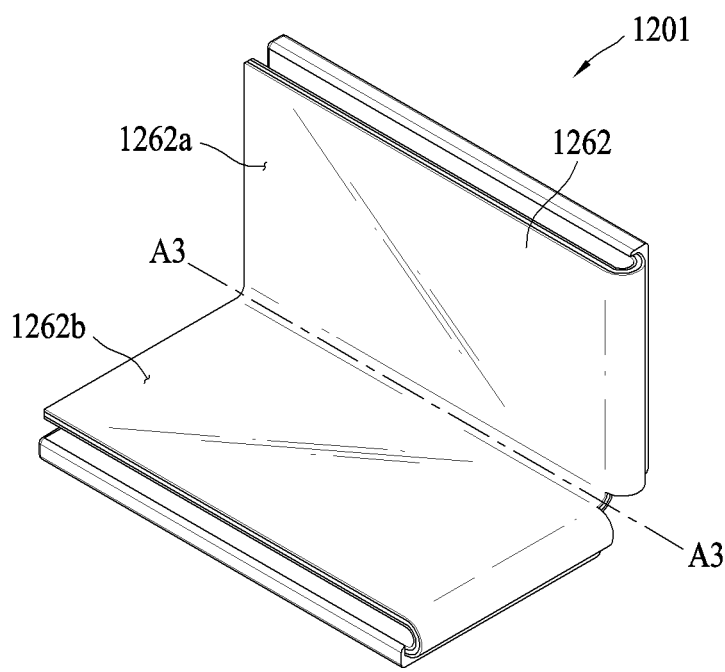
FIG. 12C is a diagram illustrating a third form of the electronic device of FIG. 12A in the fifth operation according to an example embodiment.

An operation of an electronic device 1201 according to an example embodiment is described with reference to FIGS. 12A to 12C. A form of the electronic device 1201 in a fully unfolded state as shown in FIG. 12A may be changed to a form in which a first display 1261 is folded about each of first folding axes A1-A1 and A1'-A1' as shown in FIG. 12B by one motion of a user, so that a first region 1261*a* and a third region 1261*c* of the first display 1261 may face each other and that a second region 1261*b* and a fourth region 1261*c* of the first display 1261 may face each other. In the form of the electronic device 1201 shown in FIG. 12B, the first region 1261*a* through the fourth region 1261*d* of the first display 1261 may be substantially invisible from the outside of the electronic device 1201, and a first region 1262*a* and a second region 1262*b* of a second display 1262 may be visible from the outside of the electronic device 1201. Subsequently, the form of the electronic device 1201 shown in FIG. 12B may be changed to a form of the electronic device 1201 (see FIG. 12C) in which the first display 1261 is folded outward about a second folding axis A2-A2, and at the same time, the second display 1262 is folded inward about a third folding axis A3-A3 so that the first region 1262*a* and the second region 1262*b* of the second display 1262 may form an angle (e.g., substantially 90 degrees).

Referring to 13A to 13F, an electronic device 1301 according to an example embodiment may include a first housing 1311 (e.g., the first housing 311), a second housing 1312 (e.g., the second housing 312), a third housing 1313 (e.g., the third housing 313), and a fourth housing 1314 (e.g., the fourth housing 314). The electronic device 1301 may include a first display 1361 that includes a first region 1361*a* (e.g., the first region 361*a*), a second region 1361*b* (e.g., the second region 361*b*), a third region 1361*c* (e.g., the third region 361*c*), a fourth region 1361*d* (e.g., the fourth region 361*d*), a first flexible region 1361*e* (e.g., the first flexible region 361*e*), a second flexible region 1361*g* (e.g., the second flexible region 361*g*), and a third flexible region 1361*f* (e.g., the third flexible region 3610. The electronic device 1301 may include a second display 1362 that includes a first region 1362*a* (e.g., the first region 362*a*), a second region 1362*b* (e.g., the second region 362*b*), and a fourth flexible region 1362*c* (e.g., the fourth flexible region 362*c*).

In an example embodiment, the first display 1361 may be folded outward about first folding axes B1-B1 and B1'-B1' by a first hinge structure 1321 (e.g., the first hinge structure 321*a* and the second hinge structure 321*b*). In an example embodiment, the first display 1361 may be folded inward about a second folding axis B2-B2 by a second hinge structure 1322 (e.g., the third hinge structure 322), and at the same time, the second display 1362 may be folded outward about a third folding axis B3-B3 by the second hinge structure 1322. Here, the first folding axes B1-B1 and B1'-B1' may be formed on the first display 1361 (e.g., the first flexible region 1361*e* and the third flexible region 1361*f* of the first display 1361), the second folding axis B2-B2 may be outside the first display 1361, and the third folding axis B3-B3 may be formed on the second display 1362 (e.g., the fourth flexible region 1362*c* of the second display 1362). In an example embodiment that is not shown, the electronic device 1301 may include a first elastic body (e.g., the first elastic body 331*a*) that is located in the first housing 1311 and connecting the first housing 1311 and the first region 1361*a* of the first display 1361, and a second elastic body (e.g., the second elastic body 331*b*) that is located in the second housing 1312 and connecting the second housing 1312 and the second region 1362*b* of the second display 1362. The first elastic body and/or the second elastic body may compensate for a change in a length of the first display 1361 when the first display 1361 is folded inward about the second folding axis B2-B2, thereby preventing the first display 1361 from being creased or tensioned.

In an example embodiment, a width $W_{b1}$ of the first flexible region 1361*e* and a width $W_{b2}$ of the third flexible region 1361*f* may be set sufficient large for the first display 1361 to be folded outward about the first folding axes B1-B1 and B1'-B1', and to wrap around the third housing 1313 and the fourth housing 1314. The first flexible region 1361*e* may surround at least a portion of the third housing 1313 and be bent about the first folding axes B1'-B1', and the third flexible region 1361*f* may surround at least a portion of the fourth housing 1314 and may be bent about the first folding axis B1-B1. When the first flexible region 1361*e* and the third flexible region 1361*f* are bent, at least a portion of the first region 1361*a*, the second region 1361*b*, the third region 1361*c*, the fourth region 1361*d*, the first flexible region 1361*e*, and the third flexible region 1361*f* may be exposed to the outside environment of the electronic device 1301.

In an example, when the third flexible region 1361*f* is bent about the first folding axis B1-B1, a trajectory formed by the third flexible region 1361*f* may be at least a portion of a circumference of a virtual circle based on a first origin O1 offset by a predetermined radius of curvature from the first folding axis B1-B1. In another example, the trajectory formed by the third flexible region 1361*f* may be a parabola, an exponential curve, or other geometric curves. Although not shown, in an example, when the first flexible region 1361*e* is bent about the first folding axis B1'-B1', a trajectory formed by the first flexible region 1361*e* may include at least a portion of a circumference of a virtual circle based on an origin offset by a predetermined radius of curvature from the first folding axis B1'-B1'. In another example, although not shown, the trajectory formed by the first flexible region 1361*e* may include a parabola, an exponential curve, or other geometric curves.

In an example embodiment, when the second flexible region 1361*g* is bent about the second folding axis B2-B2, and at the same time, the fourth flexible region 1362*c* is bent about the third folding axis B3-B3, a trajectory formed by the second flexible region 1361*g* may include a portion of a circumference of a virtual circle based on a second origin O2, offset by a predetermined radius of curvature from the second flexible region 1361*g*, and a trajectory formed by the fourth flexible region 1362*c* may include a portion of a circumference of a virtual circle based on the second origin O2 offset by a radius of curvature greater than the radius of curvature from the third folding axis B3-B3. The virtual circle for the trajectory formed by the second flexible region 1361*g* and the virtual circle for the trajectory formed by the fourth flexible region 1362*c* may include concentric circles. In an example embodiment, the second folding axis B2-B2 may coincide with the second origin O2.

Figure 13A:
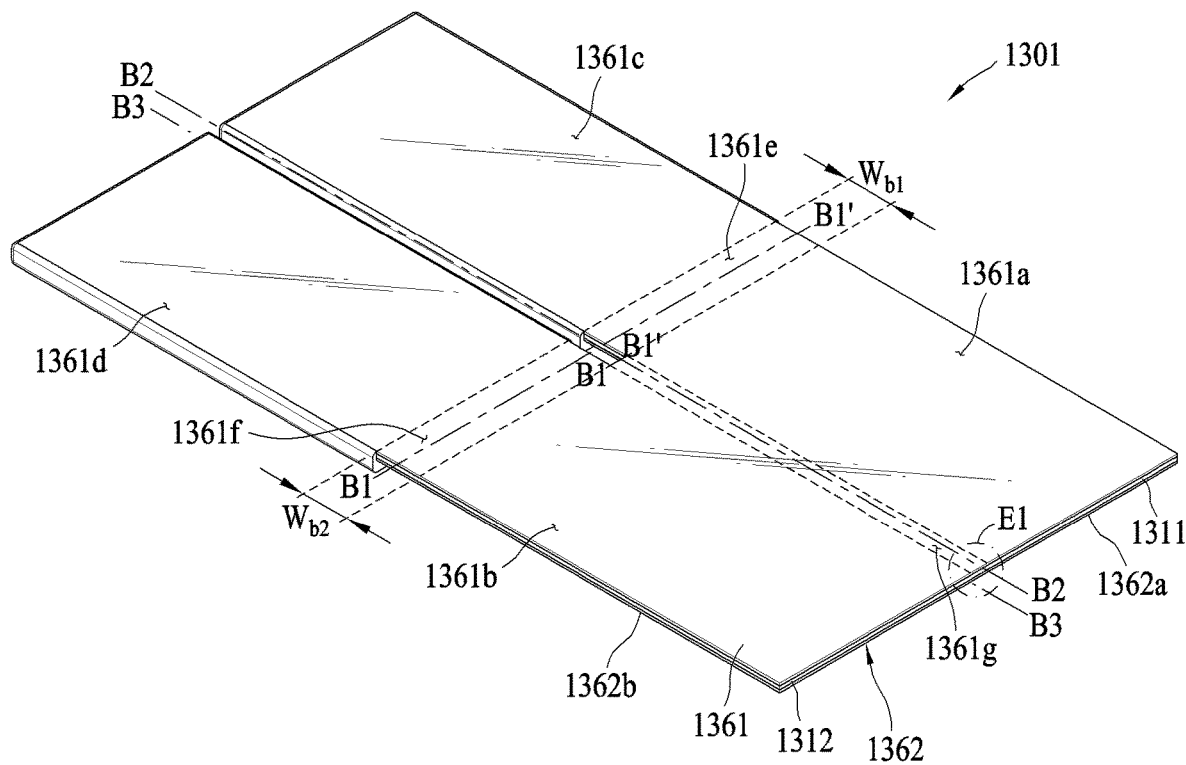
FIG. 13A is a diagram illustrating a first form of an electronic device in a sixth operation according to an example embodiment.
Figure 13B:
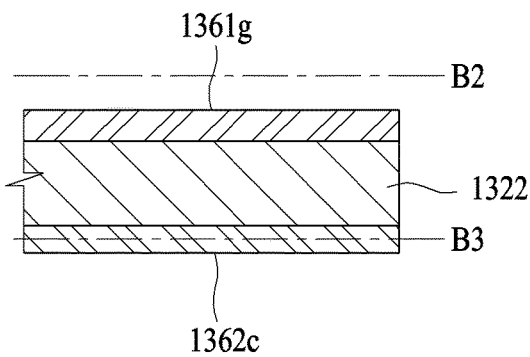
FIG. 13B is an enlarged view of a portion E1 of the electronic device of FIG. 13A.
Figure 13C:
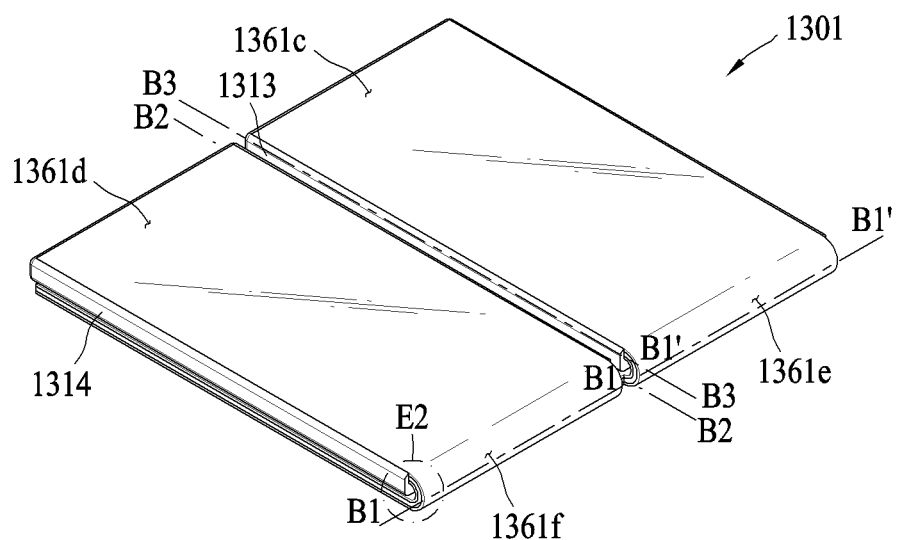
FIG. 13C is a diagram of a second form of the electronic device of FIG. 13A in the sixth operation according to an example embodiment.
Figure 13D:
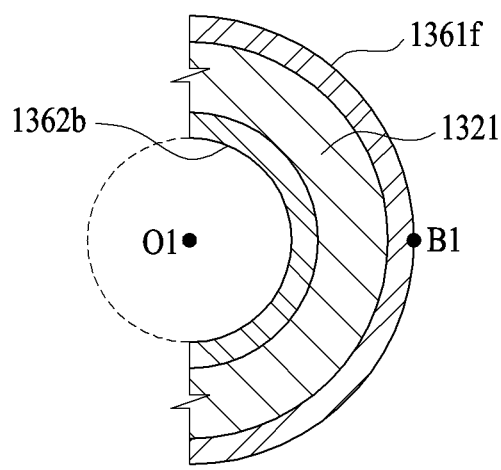
FIG. 13D is an enlarged view of a portion E2 of the electronic device of FIG. 13C.
Figure 13E:
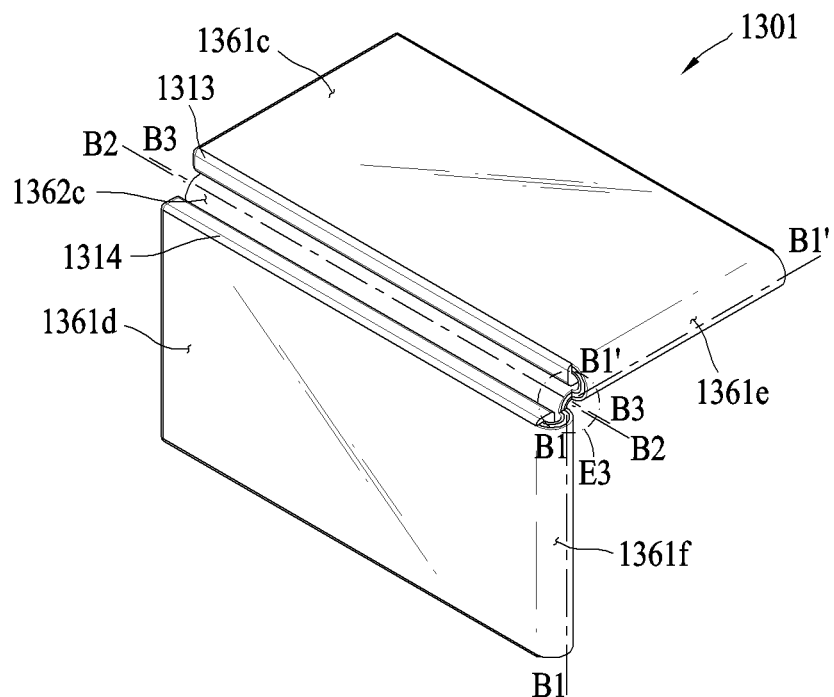
FIG. 13E is a diagram of a third form of the electronic device of FIG. 13A in the sixth operation according to an example embodiment.
Figure 13F:
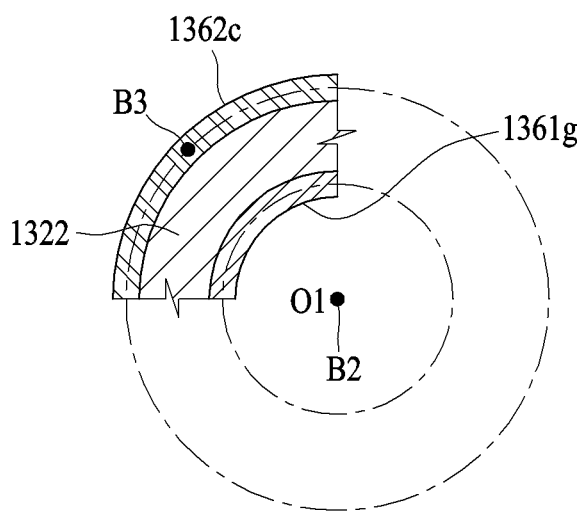
FIG. 13F is an enlarged view of a portion E3 of the electronic device of FIG. 13E.

An operation of the electronic device 1301 according to an example embodiment is described. A form in which the electronic device 1301 is fully unfolded as shown in FIG. 13A may be changed to a form of the electronic device 1301 in which the first display 1361 is folded outward about the first folding axes B1-B1 and B1'-B1' as shown in FIG. 13C by one motion of a user, so that the first flexible region 1361*e* may surround one surface (e.g., an end surface) of the third housing 1313, that the first region 1361*a* may surround at least a portion of another surface (e.g., a lower surface) of the third housing 1313, that the third flexible region 1361*f* may surround one surface (e.g., an end surface) of the fourth housing 1314 and that the second region 1362*b* may surround at least a portion of another surface (e.g., a lower surface) of the fourth housing 1314. In the form of the electronic device 1301 shown in FIG. 13C, all regions of the first display 1361 may be substantially seen from the outside of the electronic device 1301, and regions other than at least a portion of the fourth flexible region 1362*c* of the second display 1362 may not be seen from the outside of the electronic device 1301. The form of the electronic device 1301 shown in FIG. 13C may be changed to a form in which the first display 1361 is folded inward about the second folding axis B2-B2, and at the same time, the second display 1362 is folded outward about the third folding axis B3-B3 so that the first region 1361*a* and the second region 1361*b* of the first display 1361 form an angle (e.g., substantially 90 degrees) and that the third region 1361*c* and the fourth region 1361*d* form an angle (e.g., substantially 90 degrees).

According to various example embodiments, a foldable electronic device may include: a first housing 211, a second housing 212, a third housing 213 and a fourth housing 214, each having a first surface 211*a*, 212*a*, 213*a*, 214*a* and a second surface 211*b*, 212*b*, 213*b*, 214*b* opposite to the first surface, a first hinge structure 321*a* configured to connect the first housing and the third housing, a second hinge structure 321*b* configured to connect the second housing and the fourth housing, and a third hinge structure 322 configured to connect the first housing and the second housing, a first display 361 including a first region 361*a* located on a first surface of the first housing, a second region 361*b* located on a first surface of the second housing, a third region 361*c* located on a first surface of the third housing, a fourth region 361*d* located on a first surface of the fourth housing, a first flexible region 361*e* located above the first hinge structure between the first region and the third region, a second flexible region 361*g* located above the third hinge structure between the first region and the second region, and a third flexible region 361*f* located above the second hinge structure between the second region and the fourth region, a second display 362 including a first region 362*a* located on a second surface of the first housing, a second region 362*b* located on a second surface of the second housing, and a fourth flexible region 362*c* located above the third hinge structure between the first region and the second region, and a first elastic body 331*a* configured to connect the first housing and an end portion of the first region of the second display. The first display may include: a first folding axis A1-A1 located on the first flexible region and the third flexible region, and a second folding axis A2-A2 located on the second flexible region. The second display may include a third folding axis A3-A3 located outside the fourth flexible region. The first display may be configured to be folded about each of the first folding axis and the second folding axis, and the second display may be configured to be folded about the third folding axis. In an example embodiment, the foldable electronic device may further include a plate 332a configured to connect the first elastic body and the end portion of the first region of the second display and transmit a force between the first elastic body and the second display.

In an example embodiment, the foldable electronic device may further include a shaft 333a located in the first housing and configured to guide the plate.

In an example embodiment, the first housing may include: a first accommodating portion 334a that extends along the first region of the second display and in which the first elastic body and the plate linearly move, a second accommodating portion 334b that is connected to the first accommodating portion, that extends in a direction crossing a direction in which the first accommodating portion extends, and in which the plate rolls, and a third accommodating portion 334c that is connected to the second accommodating portion, that extends toward the end portion of the first region of the second display in a direction opposite to the direction in which the first accommodating portion extends, and in which the plate linearly moves.

In an example embodiment, the first hinge structure 321a and the second hinge structure 321b may be configured to fold the first display 361 inward about the first folding axis A1-A1. The third hinge structure 322 may be configured to fold the first display 361 outward about the second folding axis A2-A2 and fold the second display 362 inward about the third folding axis A3-A3.

In an example embodiment, the foldable electronic device may further include a second elastic body 331b configured to connect the second housing and an end portion of the second region of the second display.

In an example embodiment, the first elastic body 331a and the second elastic body 331b may be disposed symmetrically with respect to a virtual plane including the second folding axis A2-A2 and the third folding axis A3-A3.

In an example embodiment, the first housing may include a guide 341 configured to guide the first region of the second display so that the second display is slidable.

In an example embodiment, the guide may include: a longitudinal recess 342, and a slider 343 that is slidably received in the longitudinal recess and configured to support the first region of the second display.

In an example embodiment, the longitudinal recess may include: a first longitudinal recess 342a having a first width, and a second longitudinal recess 342b connected to the first longitudinal recess and having a second width greater than the first width. The slider may include: a first block 343a received in the first longitudinal recess, and a second block 343b connected to the first block and received in the second longitudinal recess.

In an example embodiment, the first folding axis A1-A1 and the second folding axis A2-A2 may intersect each other, and the second folding axis A2-A2 and the third folding axis A3-A3 may be parallel to each other. The first folding axis A1-A1 and the third folding axis A3-A3 may not meet each other.

In an example embodiment, folding of the first display 361 about the first folding axis A1-A1 may be performed independently of folding of the first display 361 about the second folding axis A2-A2.

In an example embodiment, folding of the first display 361 about the second folding axis A2-A2 may be performed in conjunction with folding of the second display 362 about the third folding axis A3-A3.

In an example embodiment, circular arc-shaped trajectories may be formed when the first region 361a and the third region 361c of the first display 361 are folded about the first folding axis A1-A1 and when the second region 361b and the fourth region 361d of the first display 361 are folded about the first folding axes A1-A1. A circular arc-shaped trajectory may be formed when the first region 361a and the second region 361b of the first display are folded about the second folding axis A2-A2. A circular arc-shaped trajectory may be formed when the first region 362a and the second region 362b of the second display 362 are folded about the third folding axis A3-A3.

In an example embodiment, the third region 361c and the fourth region 361d of the first display 361 may be spaced apart from each other.

In an example embodiment, the foldable electronic device 201 may take a compact form in which the first display 261 is folded about the first folding axis A1-A1 and then folded about the second folding axis A2-A2 and in which the second display 262 is folded about the third folding axis A3-A3.

In an example embodiment, the second flexible region 361g of the first display 361 may be configured to display information in the compact form.

According to various example embodiments, a foldable electronic device may include: a first housing 211, a second housing 212, a third housing 213 and a fourth housing 214, each having a first surface 211a, 212a, 213a, 214a and a second surface 211b, 212b, 213b, 214b opposite to the first surface, a first hinge structure 321a configured to connect the first housing and the third housing, a second hinge structure 321b configured to connect the second housing and the fourth housing, and a third hinge structure 322 configured to connect the first housing and the second housing, a first display 361 including a first region 361a located on a first surface of the first housing, a second region 361b located on a first surface of the second housing, a third region 361c located on a first surface of the third housing, a fourth region 361d located on a first surface of the fourth housing, a first flexible region 361e located above the first hinge structure between the first region and the third region, a second flexible region 361g located above the third hinge structure between the first region and the second region, and a third flexible region 361f located above the second hinge structure between the second region and the fourth region, and a second display 362 including a first region 362a located on a second surface of the first housing, a second region 362b located on a second surface of the second housing, and a fourth flexible region 362c located above the third hinge structure between the first region and the second region. The first display may include: a first folding axis A1-A1 located on the first flexible region and the third flexible region, and a second folding axis A2-A2 located on the second flexible region. The second display may include a third folding axis A3-A3 located outside the fourth flexible region. The first display may be configured to be folded about each of the first folding axis and the second folding axis, and the second display may be configured to be folded about the third folding axis.

In an example embodiment, the foldable electronic device may further include a first elastic body 331a configured to connect the first housing and an end portion of the first region of the second display.

In an example embodiment, the foldable electronic device may further include a second elastic body 331b configured to connect the second housing and an end portion of the second region of the second display.

What is claimed is:

1. A foldable electronic device, comprising:
   a first housing, a second housing, a third housing and a fourth housing, each having, respectively, a first surface and a second surface opposite to the first surface;
   a first hinge structure connecting the first housing and the third housing, a second hinge structure connecting the second housing and the fourth housing, and a third hinge structure connecting the first housing and the second housing;
   a slit separating the third housing and the fourth housing;
   a first display including a first region located on a first surface of the first housing, a second region located on a first surface of the second housing, a third region located on a first surface of the third housing, a fourth region located on a first surface of the fourth housing, a first flexible region located above the first hinge structure between the first region and the third region, a second flexible region located above the third hinge structure between the first region and the second region, and a third flexible region located above the second hinge structure between the second region and the fourth region;
   a second display including a first region located on a second surface of the first housing, a second region located on a second surface of the second housing, and a fourth flexible region located above the third hinge structure between the first region and the second region; and
   a first elastic body connecting the first housing and an end portion of the first region of the second display,
   wherein the first display further includes:
      a first folding axis located on the first flexible region and the third flexible region, and
      a second folding axis located on the second flexible region,
   wherein the second display includes a third folding axis located outside the fourth flexible region, and
   wherein the first display is foldable about each of the first folding axis and the second folding axis, and the second display is foldable about the third folding axis.

2. The foldable electronic device of claim 1, further comprising:
   a plate connecting the first elastic body and the end portion of the first region of the second display, and transmitting a force between the first elastic body and the second display.

3. The foldable electronic device of claim 2, further comprising:
   a shaft disposed in the first housing and configured to guide a movement of the plate.

4. The foldable electronic device of claim 3, wherein the first housing comprises:
   a first accommodating portion that extends along the first region of the second display, in which the first elastic body and the plate are linearly movable;
   a second accommodating portion connected to the first accommodating portion, extending in a direction crossing another direction in which the first accommodating portion extends, and in which the plate rolls; and
   a third accommodating portion connected to the second accommodating portion, extending toward the end portion of the first region of the second display in a direction opposite to the direction in which the first accommodating portion extends, and in which the plate is linearly movable.

5. The foldable electronic device of claim 1, wherein the first hinge structure and the second hinge structure are configured to enable folding of the first display inward about the first folding axis, and
   wherein the third hinge structure is configured to enable folding of the first display outward about the second folding axis, and folding of the second display inward about the third folding axis.

6. The foldable electronic device of claim 1, further comprising:
   a second elastic body connecting the second housing, and an end portion of the second region of the second display.

7. The foldable electronic device of claim 6, wherein the first elastic body and the second elastic body are disposed symmetrically relative to one another with respect to a virtual plane including the second folding axis and the third folding axis.

8. The foldable electronic device of claim 1, wherein the first housing further comprises:
   a guide providing guidance for sliding of at least the first region of the second display.

9. The foldable electronic device of claim 8, wherein the guide comprises:
   a longitudinal recess; and
   a slider that is slidably disposed in the longitudinal recess and configured to support the first region of the second display.

10. The foldable electronic device of claim 9, wherein the longitudinal recess includes a first longitudinal recess having a first width and a second longitudinal recess connected to the first longitudinal recess and having a second width greater than the first width, and
   wherein the slider comprises a first block received in the first longitudinal recess, and a second block connected to the first block and received in the second longitudinal recess.

11. The foldable electronic device of claim 1, wherein:
   the first folding axis and the second folding axis intersect,
   the second folding axis and the third folding axis are parallel, and
   the first folding axis and the third folding axis do not contact.

12. A foldable electronic device, comprising:
   a first housing, a second housing, a third housing and a fourth housing, each having, respectively, a first surface and a second surface opposite to the first surface;
   a first hinge structure connecting the first housing and the third housing, a second hinge structure connecting the second housing and the fourth housing, and a third hinge structure connecting the first housing and the second housing;
   a first display including a first region located on a first surface of the first housing, a second region located on a first surface of the second housing, a third region located on a first surface of the third housing, a fourth region located on a first surface of the fourth housing, a first flexible region located above the first hinge structure between the first region and the third region, a second flexible region located above the third hinge structure between the first region and the second region, and a third flexible region located above the second hinge structure between the second region and the fourth region;

a second display including a first region located on a second surface of the first housing, a second region located on a second surface of the second housing, and a fourth flexible region located above the third hinge structure between the first region and the second region; and a first elastic body connecting the first housing and an end portion of the first region of the second display, wherein the first display further includes:
- a first folding axis located on the first flexible region and the third flexible region, and
- a second folding axis located on the second flexible region, wherein the second display includes a third folding axis located outside the fourth flexible region, and wherein the first display is foldable about each of the first folding axis and the second folding axis, and the second display is foldable about the third folding axis, wherein folding of the first display about the first folding axis is independent of folding of the first display about the second folding axis.

13. The foldable electronic device of claim 1, wherein the first display is foldable about the second folding axis in conjunction with folding of the second display about the third folding axis.

14. The foldable electronic device of claim 1, wherein:
circular arc-shaped trajectories are formed when the first region and the third region of the first display are folded about the first folding axis, and when the second region and the fourth region of the first display are folded about the first folding axis, a first circular arc-shaped trajectory is formed when the first region and the second region of the first display are folded about the second folding axis, and a second circular arc-shaped trajectory is formed when the first region and the second region of the second display are folded about the third folding axis.

15. The foldable electronic device of claim 1, wherein the third region and the fourth region of the first display are disposed apart from each other.

16. The foldable electronic device of claim 1, wherein the foldable electronic device is configurable into a compact form, in which the first display is folded about the first folding axis, and folded about the second folding axis, and the second display is folded about the third folding axis.

17. The foldable electronic device of claim 16, wherein the second flexible region of the first display is configured to display information when the foldable electronic device is configured into the compact form.

18. A foldable electronic device, comprising:
a first housing, a second housing, a third housing and a fourth housing, each having, respectively, a first surface and a second surface opposite to the first surface;

a first hinge structure connecting the first housing and the third housing, a second hinge structure connecting the second housing and the fourth housing, and a third hinge structure connecting the first housing and the second housing;

a slit separating the third housing and the fourth housing;

a first display including a first region located on a first surface of the first housing, a second region located on a first surface of the second housing, a third region located on a first surface of the third housing, a fourth region located on a first surface of the fourth housing, a first flexible region located above the first hinge structure between the first region and the third region, a second flexible region located above the third hinge structure between the first region and the second region, and a third flexible region located above the second hinge structure between the second region and the fourth region; and a second display including a first region located on a second surface of the first housing, a second region located on a second surface of the second housing, and a fourth flexible region located above the third hinge structure between the first region and the second region, wherein the first display comprises:
- a first folding axis spanning the first flexible region and the third flexible region; and
- a second folding axis spanning the second flexible region, wherein the second display includes a third folding axis located outside the fourth flexible region, and wherein the first display is foldable about each of the first folding axis and the second folding axis, and the second display is foldable about the third folding axis.

19. The foldable electronic device of claim 18, further comprising:
a first elastic body connecting the first housing and an end portion of the first region of the second display.

20. The foldable electronic device of claim 19, further comprising:
a second elastic body connecting the second housing and an end portion of the second region of the second display.

* * * * *